(12) United States Patent
Hamasaki et al.

(10) Patent No.: US 10,930,748 B2
(45) Date of Patent: Feb. 23, 2021

(54) SEMICONDUCTOR DEVICE

(71) Applicant: Panasonic Intellectual Property Management Co., Ltd., Osaka (JP)

(72) Inventors: Masao Hamasaki, Osaka (JP); Masaaki Hirako, Shiga (JP); Ryosuke Okawa, Nara (JP); Ryou Kato, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 18 days.

(21) Appl. No.: 16/488,224

(22) PCT Filed: Jan. 17, 2019

(86) PCT No.: PCT/JP2019/001316
§ 371 (c)(1),
(2) Date: Aug. 22, 2019

(87) PCT Pub. No.: WO2019/244384
PCT Pub. Date: Dec. 26, 2019

(65) Prior Publication Data
US 2020/0395454 A1 Dec. 17, 2020

Related U.S. Application Data

(60) Provisional application No. 62/687,007, filed on Jun. 19, 2018.

(51) Int. Cl.
*H01L 29/417* (2006.01)
*H01L 23/00* (2006.01)
(Continued)

(52) U.S. Cl.
CPC ...... *H01L 29/41741* (2013.01); *H01L 23/562* (2013.01); *H01L 27/088* (2013.01);
(Continued)

(58) Field of Classification Search
None
See application file for complete search history.

(56) References Cited

U.S. PATENT DOCUMENTS 5,674,766 A 10/1997 Darwish et al.
5,895,952 A 4/1999 Darwish et al.
(Continued)

FOREIGN PATENT DOCUMENTS

JP H08-250731 A 9/1996
JP 2011-219828 A 11/2011
(Continued)

OTHER PUBLICATIONS

Office Action issued in Japanese Patent Application No. 2019-216490, dated May 12, 2020.
(Continued)

*Primary Examiner* — Thien F Tran
(74) *Attorney, Agent, or Firm* — McDermott Will & Emery LLP

(57) ABSTRACT

A semiconductor device includes: a semiconductor (10 µm≤$t_{si}$≤30 µm); a metal layer (30 µm≤$t_{ag}$≤60 µm) comprising Ag; a metal layer (10 µm≤$t_{ni}$≤35 µm) comprising Ni; and transistors. The transistors include a source electrode and a gate electrode on the semiconductor layer. The metal layer functions as a common drain region for the transistors. The ratio of the lengths of the longer side and the shorter side of the semiconductor layer is at most 1.73. The ratio of the surface area and the perimeter length of each electrode included in the source electrode is at most 0.127. The cumulative surface area of the source electrode and the gate electrode is at most 2.61 mm². The length of the shorter side of the source electrode is at most 0.3 mm, and $702 < 2.33 \times t_{si} + 10.5 \times t_{ag} + 8.90 \times t_{ni} < 943$ is satisfied.

20 Claims, 9 Drawing Sheets

(51) Int. Cl.
   *H01L 29/78* (2006.01)
   *H01L 29/10* (2006.01)
   *H01L 29/45* (2006.01)
   *H01L 27/088* (2006.01)

(52) U.S. Cl.
   CPC ........ *H01L 29/1095* (2013.01); *H01L 29/456* (2013.01); *H01L 29/7813* (2013.01)

(56) References Cited

U.S. PATENT DOCUMENTS

| | | | |
|---|---|---|---|
| 10,340,347 B1* | 7/2019 | Yoshida | H01L 24/06 |
| 2013/0320454 A1 | 12/2013 | Suzuki et al. | |
| 2017/0358510 A1 | 12/2017 | Park et al. | |
| 2018/0090611 A1 | 3/2018 | Togami | |
| 2018/0122939 A1 | 5/2018 | Ota et al. | |
| 2019/0157403 A1 | 5/2019 | Yasuda et al. | |
| 2019/0319126 A1* | 10/2019 | Matsushima | H01L 24/83 |

FOREIGN PATENT DOCUMENTS

| | | |
|---|---|---|
| JP | 2012-182238 A | 9/2012 |
| JP | 2013-247309 A | 12/2013 |
| JP | 2016-86006 A | 5/2016 |
| JP | 2018-049974 A | 3/2018 |
| WO | 2017/002368 A1 | 1/2017 |
| WO | 2018/025839 A1 | 2/2018 |
| WO | 2018/123799 A1 | 7/2018 |

OTHER PUBLICATIONS

International Search Report issued in corresponding International Patent Application No. PCT/JP2019/001316, dated Apr. 9, 2019.
Written Opinion of the International Searching Authority issued in corresponding International Patent Application No. PCT/JP2019/001316, dated Mar. 27, 2019, with English translation.
Watanabe, T., "Structure Control Therory of Plated Film—Part of Epitaxy," Journal of Japan Institute of Metals, vol. 66, No. 4, (2002), pp. 362-370, overview with English abstract.
Watanabe, T. (Doctor of Engineering), "Fine Platin, Mekkimaku no Kozoseigyo gijyutsu to Kaisekiho (Techniques of Structural Control of Plated Film and Analytical Methods Therefor)," Technical Information Institute Co., Ltd., Feb. 28, 2002, with partial translation.

* cited by examiner (a)

(b)

(c)

| S: ELECTRODE SURFACE AREA |
| L: ELECTRODE PERIMETER LENGTH |
| t: SOLDER BUMP HEIGHT |
| Δt: SETTLE AMOUNT |
| F: FORCE ACTING ON SOLDER BUMP |

$$F \propto \frac{\Delta t \cdot S}{(t-\Delta t) \cdot L} = \frac{S}{L} \cdot \frac{\Delta t}{(t-\Delta t)}$$

SEMICONDUCTOR DEVICE

CROSS-REFERENCE OF RELATED APPLICATIONS

This application is the U.S. National Phase under 35 U.S.C. § 371 of International Patent Application No. PCT/JP2019/001316, filed on Jan. 17, 2019, which in turn claims the benefit of U.S. Application No. 62/687,007, filed on Jun. 19, 2018, the entire disclosures of which Applications are incorporated by reference herein.

TECHNICAL FIELD

The present disclosure relates to semiconductor devices, and in particular to chip-size-package-type semiconductor devices that are facedown mountable.

BACKGROUND ART

Conventionally, a semiconductor device has been proposed that includes; a semiconductor layer having a first principal surface and a second principal surface; two vertical field-effect transistors provided extending from the first principal surface to the second principal surface, and a metal layer formed on the second principal surface. This configuration allows not only a horizontal path in the semiconductor substrate, but a horizontal path in the metal layer, where conduction resistance is low, to be used as a path along which current flows from the first transistor to the second transistor, whereby the on-resistance of the semiconductor device can be lowered.

Patent Literature (PTL) 1 proposes a flip-chip semiconductor device which has, in addition to the above configuration, a conductive layer formed on a side of the metal layer that is the side opposite to the semiconductor substrate. The conductive layer can inhibit burrs of the metal layer from forming in the chip singulation step.

PTL 2 proposes a flip-chip semiconductor device which has, in addition to the above configuration, an insulating coating formed on a side of the metal layer that is the side opposite to the semiconductor substrate. The insulating coating can prevent scratches, breaks, and other damages while keeping the semiconductor device thin.

CITATION LIST

Patent Literature

PTL 1: Japanese Unexamined Patent Application Publication No. 2016-86006
PTL 2: Japanese Unexamined Patent Application Publication No. 2012-182238

SUMMARY OF THE INVENTION

Technical Problems

However, in the semiconductor devices disclosed in PTL 1 and PTL 2, the coefficient of thermal expansion of the metal layer is greater than the coefficient of thermal expansion of the semiconductor substrate, which causes the semiconductor device to warp from changes in temperature. For example, when the semiconductor device is mounted via a flip-chip method using solder as the bonding material, the semiconductor device warps in the high temperature environment during reflow soldering. When the semiconductor device warps a lot, defects pertaining to mounting are more prone to occur.

In PTL 1, the conductive layer is formed on a side of the metal layer that is the side opposite to the semiconductor substrate, but since the conductive layer primarily contains the same metal contained in the metal layer, from a manufacturing viewpoint, it is not easy to form a conductive layer thick enough to reduce the warpage of the semiconductor device from changes in temperature.

In PTL 2, an insulating coating for reducing the thickness of the semiconductor device and preventing damage of the semiconductor device is formed on a side of the metal layer that is the side opposite to the semiconductor substrate, but no stress great enough to reduce the warpage of the semiconductor device is induced in the insulating coating when the metal layer is formed at a thickness required to ensure low on-resistance.

Moreover, with the semiconductor devices disclosed in PTL 1 and PTL 2, when the semiconductor device is mounted via a flip-chip method using solder as the bonding material, in the high temperature environment during reflow soldering, joint defects, such as the solder protruding out under the weight of the semiconductor device, occur. Such joint defects are also related to semiconductor device warpage, but the defects cannot be resolved by just inhibiting warpage of the semiconductor device.

Stated differently, the semiconductor devices disclosed in PTL 1 and PTL 2 cannot both inhibit warpage of the semiconductor device and resolve joint defects such as solder protrusion, while also lowering the on-resistance.

In view of this, the present disclosure has an object to provide a chip-size-package-type semiconductor device that can both inhibit warpage of the semiconductor device and resolve joint defects such as solder protrusion, while also lowering the on-resistance.

Solution to Problems

In order to overcome the above described problems, in one aspect of the present disclosure, a semiconductor device, which is a chip-size-package-type semiconductor device that is facedown mountable, includes: a semiconductor layer including a first principal surface and a second principal surface that face in opposite directions; a first metal layer that includes a third principal surface and a fourth principal surface that face in opposite directions, is disposed with the third principal surface in contact with the second principal surface, comprises silver, and has a thickness of at least 30 μm and less than 60 μm; a second metal layer that includes a fifth principal surface and a sixth principal surface that face in opposite directions, is disposed with the fifth principal surface in contact with the fourth principal surface, comprises nickel, and has a thickness of at least 10 μm and less than 35 μm; a first vertical MOS transistor disposed in a first region of the semiconductor layer; and a second vertical MOS transistor disposed in a second region of the semiconductor layer, the second region being adjacent to the first region in a direction along the first principal surface. The semiconductor layer includes: a semiconductor substrate that is disposed on the second principal surface side among the first principal surface and the second principal surface, and comprises silicon containing an impurity of a first conductivity type; and a low-concentration impurity layer that is disposed on the first principal surface side among the first principal surface and the second principal surface, is in contact with the semiconductor substrate, and contains an impurity of the first conductivity type in a lower concentration than a concentration of the impurity of the first conductivity type in the semiconductor substrate. The first vertical MOS transistor includes a first source electrode and a first gate electrode on a surface of the low-concentration impurity layer. The second vertical MOS transistor includes a second source electrode and a second gate electrode on the surface of the low-concentration impurity layer. In a plan view of the semiconductor layer, (i) the first source electrode and the first gate electrode, and (ii) the second source electrode and the second gate electrode have line symmetry about a boundary line that divides a longer side of the semiconductor layer into two parts. The semiconductor layer has a thickness of at least 10 µm and at most 30 µm. The semiconductor substrate functions as a common drain region serving as both a first drain region of the first vertical MOS transistor and a second drain region of the second vertical MOS transistor. A bidirectional path from the first source electrode to the second source electrode via the first drain region, the first metal layer, and the second drain region is a primary current path. A ratio of lengths of the longer side and a shorter side of the semiconductor layer is at most 1.73. A ratio of a surface area and a perimeter length of each electrode included in the first source electrode and the second source electrode is at most 0.127. A cumulative surface area of the first source electrode, the first gate electrode, the second source electrode, and the second gate electrode is at most 2.61 mm². A length of a shorter side of each of the first source electrode and the second source electrode is at most 0.3 mm, and $702 < 2.33 \times t_{si} + 10.5 \times t_{ag} + 8.90 \times t_{ni} < 943$ is satisfied, where $t_{si}$ (µm) is the thickness of the semiconductor layer, $t_{ag}$ (µm) is the thickness of the first metal layer, and $t_{ni}$ (µm) is the thickness of the second metal layer.

This configuration makes it possible to inhibit warpage of the semiconductor device that occurs as a result of the semiconductor layer and the first metal layer contacting, since the first metal layer (Ag layer) and the second metal layer (Ni layer) having thicknesses for ensuring a low on-resistance are in contact with one another. Moreover, stipulating the layout of the electrodes and the weight of the semiconductor device makes it possible to keep the occurrence of solder protrusion and voids (herein after an occurrence of a solder protrusion and an occurrence of a void are each referred to as a "solder joint defect") to within an allowable range stipulated by a standard. Accordingly, the present disclosure can provide a chip-size-package-type semiconductor device that can both inhibit warpage of the semiconductor device and resolve solder joint defects, while also lowering the on-resistance.

Advantageous Effects of Invention

With the semiconductor device according to the present disclosure, it is possible to provide a chip-size-package-type semiconductor device that can both inhibit warpage of the semiconductor device and resolve solder joint defects, while also lowering the on-resistance.

DESCRIPTION OF EXEMPLARY EMBODIMENT

The following embodiment is a specific example of the present disclosure. The numerical values, shapes, materials, elements, arrangement and connection configuration of the elements, etc., described in the following embodiment are merely examples, and are not intended to limit the present disclosure. Among elements in the following embodiment, those not described in any one of the independent claims indicating the broadest concept of the present disclosure are described as optional elements.

In the present disclosure, the terminology "A and B are electrically connected" includes configurations in which A and B are directly connected via wiring, configurations in which A and B are directly connected without wiring, and configurations in which A and B are indirectly connected via a resistive component (resistor element or resistive wire).

Embodiment

[1. Structure of Semiconductor Device]

Hereinafter, the structure of semiconductor device 1 according to the present embodiment will be described. Semiconductor device 1 according to the present disclosure is a facedown mountable, chip-size-package (CSP) type multi-transistor chip including two vertical metal oxide semiconductor (MOS) transistors formed on a semiconductor substrate. The two vertical MOS transistors are each a power transistor and what is called a trench MOS field effect transistor (FET).

Figure 1:
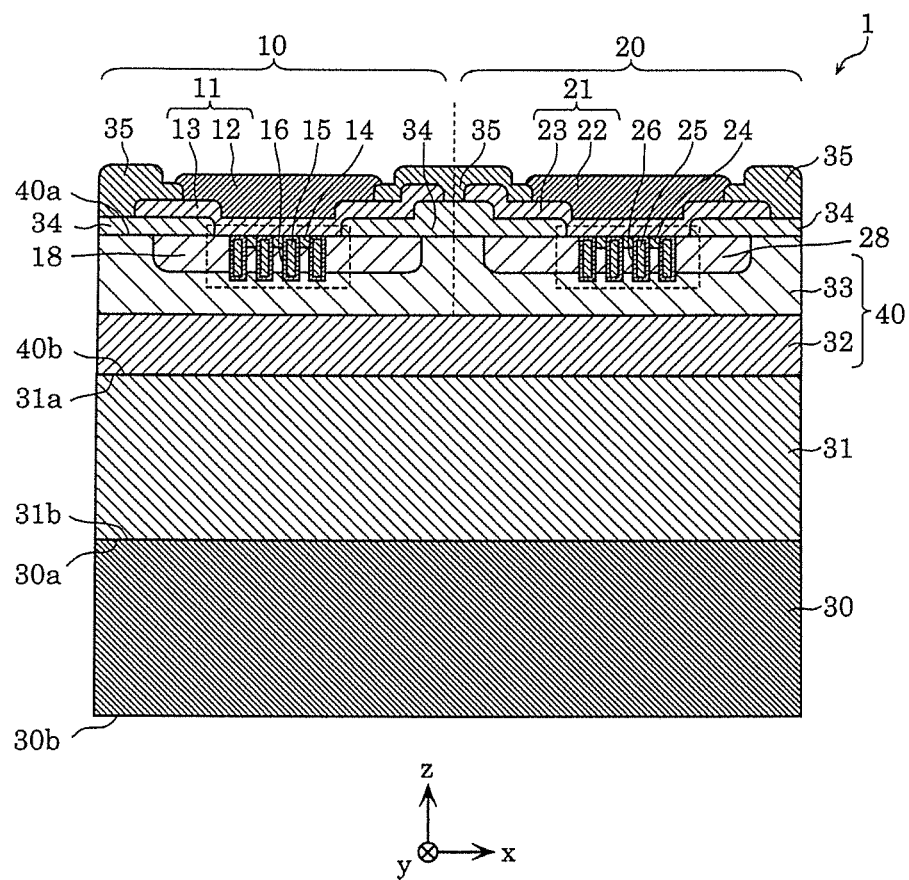
FIG. 1 is a cross-sectional view illustrating one example of the structure of a semiconductor device according to an embodiment.
Figure 2:
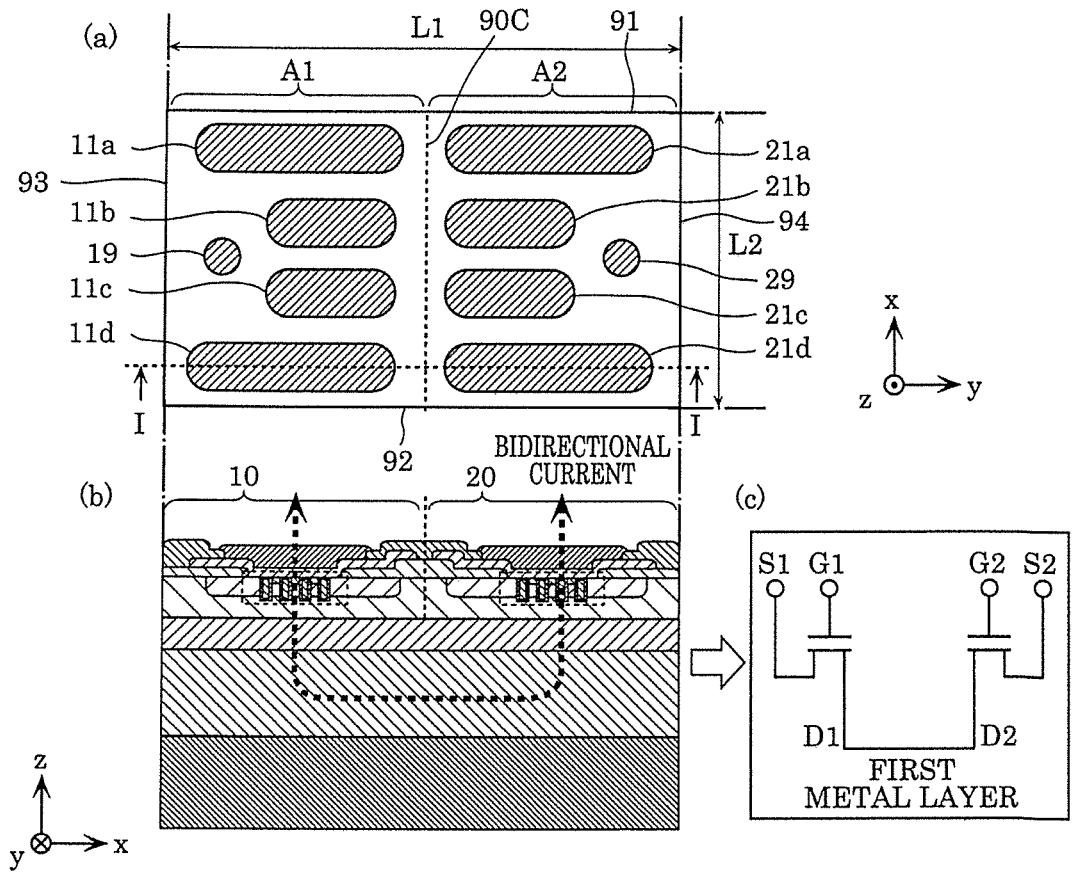
FIG. 2 includes a top view illustrating one example of an electrode configuration of a semiconductor device according to an embodiment and a cross-sectional schematic view illustrating the flow of bidirectional current in the semiconductor device.

FIG. 1 is a cross-sectional view illustrating one example of the structure of semiconductor device 1 according to an embodiment. FIG. 2 includes a top view illustrating one example of an electrode configuration of semiconductor device 1 according to an embodiment and a cross-sectional schematic view illustrating the flow of bidirectional current in semiconductor device 1 according to an embodiment. The cross-sectional view of FIG. 1 shows the plane taken along line I-I in (a) in FIG. 2.

As illustrated in FIG. 1, semiconductor device 1 includes semiconductor layer 40, metal layers 30 and 31, first vertical MOS transistor 10 (hereinafter referred to as transistor 10), and second vertical MOS transistor 20 (hereinafter referred to as transistor 20).

Semiconductor layer 40 (hereinafter also referred to as a Si layer) includes principal surface 40a (first principal surface) and principal surface 40b (second principal surface) that face in opposite directions. Semiconductor layer 40 has a stacked structure of semiconductor substrate 32 and low-concentration impurity layer 33.

Semiconductor substrate 32 is disposed on the principal surface 40b side of semiconductor layer 40 and comprises silicon containing a first conductivity type impurity.

Low-concentration impurity layer 33 is disposed on the principal surface 40a side of semiconductor layer 40, formed in contact with semiconductor substrate 32, and contains a lower concentration of an impurity of the first conductivity type than the concentration of the impurity of the first conductivity type contained in semiconductor substrate 32. Low-concentration impurity layer 33 may be formed on semiconductor substrate 32, for example, in an epitaxial growth process.

Metal layer 31 (hereinafter also referred to as a Ag layer) is a first metal layer that includes principal surface 31a (third principal surface) and principal surface 31b (fourth principal surface) that face in opposite directions, is formed such that principal surface 31a is in contact with principal surface 40b, comprises silver (Ag), and has a thickness of at least 30 µm and less than 60 µm.

Metal layer 30 (hereinafter also referred to as a Ni layer) is a second metal layer that includes principal surface 30a (fifth principal surface) and principal surface 30b (sixth principal surface) that face in opposite directions, is formed such that principal surface 30a is in contact with principal surface 31b, comprises nickel (Ni), and has a thickness of at least 10 µm and less than 35 µm. Since the Young's modulus of nickel (Ni) is higher than the Young's modulus of silver (Ag), the Young's modulus of metal layer 30 is higher than the Young's modulus of metal layer 31.

Note that metal layers 30 and 31 may include a trace amount of an element other than the metal mixed in as an impurity in the manufacturing of the metal material.

Moreover, as illustrated in FIG. 1 as well as (a) and (b) in FIG. 2, in a plan view of the Si layer, transistor 10 formed in first region A1 includes, on the principal surface 40a side of semiconductor layer 40, four source electrodes 11a, 11b, 11c, and 11d (each corresponding to one of source electrodes 11), and one gate electrode 19 (first gate electrode). Moreover, transistor 20 formed in second region A2 adjacent to first region A1 in a direction along principal surface 40a includes four source electrodes 21a, 21b, 21c, and 21d (each corresponding to one of source electrodes 21), and one gate electrode 29 (second gate electrode).

As illustrated in (a) in FIG. 2, in a plan view of the rectangular Si layer, semiconductor device 1 includes first region A1 in which transistor 10 is formed and second region A2 in which transistor 20 is formed, so as to have line symmetry. Here, the line of symmetry is boundary line 90C that passes through the center region of the longer sides of the rectangular Si layer.

Transistor 10 includes, on the surface of low-concentration impurity layer 33 in first region A1, gate electrode 19 and a plurality of source electrodes 11 (source electrodes 11a through 11d).

Gate electrode 19 is formed such that, in a plan view of the Si layer, no other electrode is formed between gate electrode 19 and one shorter side 93 of the Si layer.

In a plan view of the Si layer, source electrodes 11 (first source electrode: source electrodes 11a through 11d) include approximately rectangular source electrodes 11a through 11d that are disposed in a striped pattern such that the lengthwise direction of each of source electrodes 11a through 11d is parallel to the longer sides of the Si layer.

Transistor 20 includes, on the surface of low-concentration impurity layer 33 in second region A2, gate electrode 29 and a plurality of source electrodes 21 (source electrodes 21a through 21d).

Gate electrode 29 is formed such that, in a plan view of the Si layer, no other electrode is formed between gate electrode 29 and the other shorter side 94 of the Si layer.

In a plan view of the Si layer, source electrodes 21 (second source electrode: source electrodes 21a through 21d) include approximately rectangular source electrodes 21a through 21d that are disposed in a striped pattern such that the lengthwise direction of each of source electrodes 21a through 21d is parallel to the longer sides of the Si layer.

Here, the approximately rectangular shape of each of source electrodes 11a through 11d and 21a through 21d includes shapes in which the ends of the longer sides are truncated into an arc-shape, such as illustrated in (a) in FIG. 2, or polygonal shape.

Here, in a plan view of the Si layer, the set of electrodes including gate electrode 19 and source electrodes 11 and the set of electrodes including gate electrode 29 and source electrodes 21 are formed so as to have line symmetry about boundary line 90C that divides each of longer side 91 and longer side 92 of the Si layer into two parts.

Note that one or more of each of gate electrode 19 and gate electrode 29 may be provided; gate electrode 19 and gate electrode 29 are not necessarily limited to one each as exemplified in (a) in FIG. 2.

Moreover, two or more source electrodes 11 and two or more source electrodes 21 may be provided; source electrodes 11 and source electrodes 21 are not necessarily limited to four each as exemplified in (a) in FIG. 2.

Note that gate electrode 19 and gate electrode 29 may each have a shape whose width in a direction parallel to the lengthwise direction of semiconductor layer 40 is wider than the width in a direction parallel to the crosswise direction of semiconductor layer 40. Alternatively, gate electrode 19 and gate electrode 29 may each have a circular shape as illustrated in (a) in FIG. 2.

As illustrated in FIG. 1 and FIG. 2, body region 18 containing an impurity of a second conductivity type that is different from the first conductivity type is formed in first region A1 of low-concentration impurity layer 33. Source region 14, which contains a first conductivity type impurity, gate conductor 15, and gate insulating film 16 are formed in body region 18. Each source electrode 11 includes section 12 and section 13. Section 12 is connected to source region 14 and body region 18 via section 13. Gate conductor 15 is electrically connected to gate electrode 19.

Section 12 of source electrode 11 is a layer that is joined by solder during reflow soldering, and in one non-limiting example, may comprise a metal material including at least one of nickel, titanium, tungsten, and palladium. The surface of section 12 may be plated with, for example, gold plating.

Section 13 of source electrode 11 is a layer that connects section 12 and semiconductor layer 40, and in one non-limiting example, may comprise a metal material including at least one of aluminum, copper, gold, and silver.

Body region 28 containing an impurity of the second conductivity type that is different from the first conductivity type is formed in second region A2 of low-concentration impurity layer 33. Source region 24, which contains a first conductivity type impurity, gate conductor 25, and gate insulating film 26 are formed in body region 28. Each source electrode 21 includes section 22 and section 23. Section 22 is connected to source region 24 and body region 28 via section 23. Gate conductor 25 is electrically connected to gate electrode 29.

Section 22 of source electrode 21 is a layer that is joined by solder during reflow soldering, and in one non-limiting example, may comprise a metal material including at least one of nickel, titanium, tungsten, and palladium. The surface of section 22 may be plated with, for example, gold plating.

Section 23 of source electrode 21 is a layer that connects section 22 and semiconductor layer 40, and in one non-limiting example, may comprise a metal material including at least one of aluminum, copper, gold, and silver.

The above configurations of transistors 10 and 20 allow semiconductor substrate 32 to act as a common drain region serving as both the first drain region of transistor 10 and the second drain region of transistor 20. Moreover, the primary current path in semiconductor device 1 is the bidirectional path from source electrodes 11 to source electrodes 21 via first drain region, metal layer 31, and second drain region.

Body region 18 and body region 28 are covered with interlayer insulating film 34 having openings and are provided with sections 13 and 23 of the source electrodes connected to source region 14 and source region 24 via the openings of interlayer insulating film 34. Interlayer insulating film 34 and sections 13 and 23 of the source electrodes are covered with passivation layer having openings and are provided with sections 12 and 22 of the source electrodes connected to sections 13 and 23 of the source electrodes via the openings of passivation layer 35.

Moreover, a standard design example of each structure in semiconductor device 1 according to the present embodiment is one in which the thickness of semiconductor layer 40 is 20 μm, the cumulative thickness of metal layers 30 and 31 is 80 μm, and the cumulative thickness of interlayer insulating film 34 and passivation layer 35 is 8 μm.

[2. Operations Performed by Semiconductor Device]

In semiconductor device 1 illustrated in FIG. 1, assuming, for example, that the first conductivity type is n type and the second conductivity type is p type, source region 14, source region 24, semiconductor substrate 32, and low-concentration impurity layer 33 may comprise an n-type semiconductor, and body region 18 and body region 28 may comprise a p-type semiconductor.

Moreover, assuming, for example, that the first conductivity type is p type and the second conductivity type is n type, source region 14, source region 24, semiconductor substrate 32, and low-concentration impurity layer 33 may comprise a p-type semiconductor, and body region 18 and body region 28 may comprise an n-type semiconductor.

The following description describes conductive operations performed by semiconductor device 1 in a case in which semiconductor device 1 is what is known as an N-channel transistor where the first conductivity type is n type and the second conductivity type is p type.

In semiconductor device 1 illustrated in FIG. 1, when high voltage is applied to source electrodes 11, low voltage is applied to source electrodes 21, and voltage higher than or equal to a threshold is applied to gate electrode 29 (gate conductor 25) with respect to source electrodes 21 as a reference, a conducting channel is formed in the vicinity of gate insulating film 26 in body region 28. As a result, current flows along the path from source electrodes 11 to body region 18 to low-concentration impurity layer 33 to semiconductor substrate 32 to metal layer 31 to semiconductor substrate 32 to low-concentration impurity layer 33 to the conducting channel formed in body region 28 to source region 24 and to source electrodes 21, thereby placing semiconductor device 1 in a conductive state. Note that the surface of contact between body region 18 and low-concentration impurity layer 33 in this conducting path includes a P-N junction, which serves as a body diode. Moreover, since this on-current flows through metal layer 31, increasing the thickness of metal layer 31 increases the cross-sectional area of the on-current path, which reduces the on-resistance of semiconductor device 1. This conductive state corresponds to the charge state illustrated in FIG. 3, which will be described later.

[3. Configuration for Achieving Both a Reduction in Warpage and a Low On-Resistance of Semiconductor Device]

Figure 3:
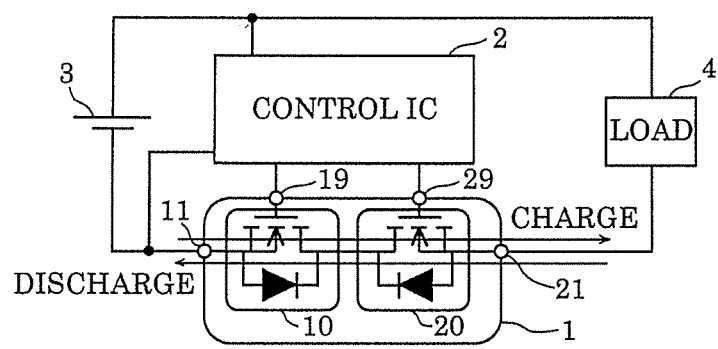
FIG. 3 is a circuit diagram illustrating an example of an application of a semiconductor device according to an embodiment in a charge/discharge circuit.

FIG. 3 is a circuit diagram illustrating an example of an application of semiconductor device 1 in a charge/discharge circuit of a smartphone or tablet. Semiconductor device 1 controls discharging operations from battery 3 to load 4 and charging operations from load 4 to battery 3 depending on the control signal applied by control IC 2. When semiconductor device 1 is implemented as a charge/discharge circuit in a smartphone or tablet in this way, the on-resistance is required to be lower than or equal to a value in a range of from 2.2 mΩ to 2.4 mΩ as a 20 V withstand voltage specification, due to a short charge period, rapid charging, and other restrictions.

Figure 4A:
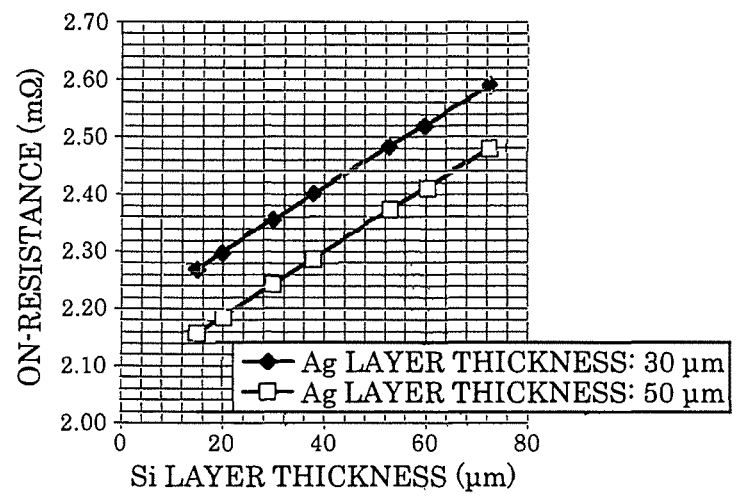
FIG. 4A illustrates, a graph of on-resistance relative to Si layer thickness in prototypes of a semiconductor device having a stacked structure of a Si layer and a Ag layer.
Figure 4B:
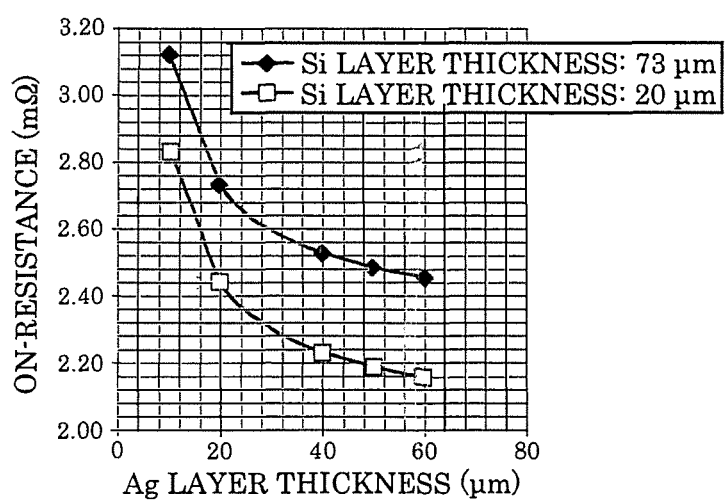
FIG. 4B illustrates a graph of on-resistance relative to Ag layer thickness in prototypes of a semiconductor device having a stacked structure of a Si layer and a Ag layer.

FIG. 4A illustrates a graph of on-resistance relative to Si layer thickness in prototypes of a semiconductor device having a stacked structure of a Si layer and a Ag layer. FIG. 4B illustrates a graph of on-resistance relative to Ag layer thickness in prototypes of a semiconductor device having a stacked structure of a Si layer and a Ag layer.

As illustrated in FIG. 4A, forming the Si layer as a thin film in thicknesses from 73 µm to 20 µm lowers the on-resistance by approximately 0.3 rag, and as illustrated in FIG. 4B, forming the Ag layer as a thin film in thicknesses from 30 µm to 50 µm lowers the on-resistance by approximately 0.1 mΩ, Further reducing the thickness of the Si layer achieves even lower on-resistances, but doing so is problematic from a manufacturing standpoint, as it amplifies the unevenness in film thickness and increases the probability of local fracturing and cracking in the wafer surface of the semiconductor substrate. Accordingly, it is difficult to stably reduce the thickness of the Si layer below 10 µm. Moreover, increasing the thickness of the Ag layer beyond 50 µm enters the realm in Which contribution to achieving a low on-resistance converges. Thus, one can determine that increasing the thickness beyond 60 µm in particular would produce little to no improvement.

As illustrated in FIG. 4A, in order to yield an on-resistance of 2.4 mΩ or less in the stacked structure of the Si layer and the Ag layer, the Si layer thickness is desirably 30 µm or less. Based on this and the manufacturing limitations pertaining to reducing the thickness of the Si layer, the Si layer thickness is desirably at least 10 µm and at most 30 µm.

However, regulating the thicknesses of the Si layer and the Ag layer to dimensions required to achieve a sufficiently low on-resistance tends to increase the warpage of semiconductor device 1. In implementations in which semiconductor device 1 is mounted on a mounting substrate, source electrodes 11, gate electrode 19, source electrodes 21, and gate electrode 29 are joined to electrodes provided on the mounting substrate via a conductive bonding material, such as solder, via facedown mounting. In such cases, the greater the warpage of semiconductor device 1 is, the more unstable the electrical connections of source electrodes 11, gate electrode 19, source electrodes 21, and gate electrode 29 to the electrodes provided on the mounting substrate are. Stated differently, to further stabilize the mounting of semiconductor device 1 onto the mounting substrate, the warpage of semiconductor device 1 needs to be reduced.

Figure 5A:
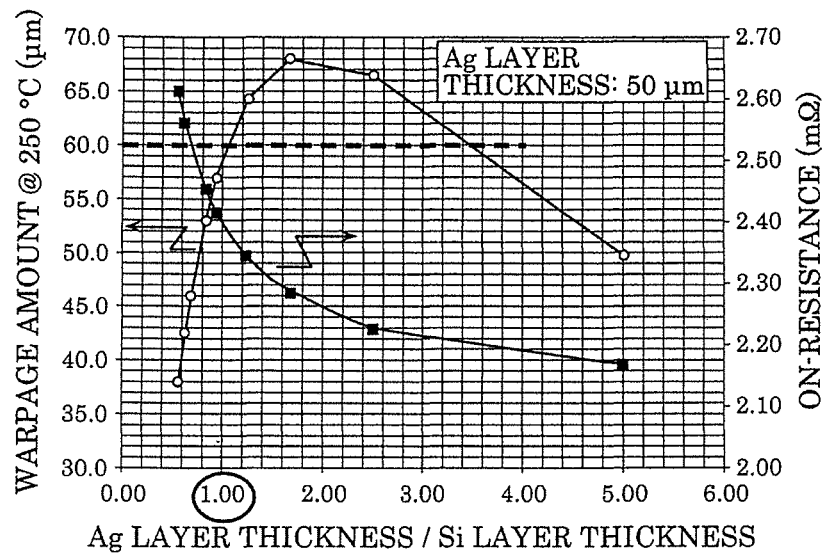
FIG. 5A illustrates a graph of amount of warpage and on-resistance relative to Ag layer thickness/Si layer thickness in prototypes of a semiconductor device having a stacked structure of a Si layer and a Ag layer.

FIG. 5A illustrates a graph of amount of warpage and on-resistance relative to Ag layer thickness/Si layer thickness (i.e., the quotient of Ag layer thickness divided by Si layer thickness) in prototypes of a semiconductor device having a stacked structure of a Si layer and a Ag layer. More specifically, FIG. 5A illustrates on-resistance and the amount of warpage at 250 degrees Celsius in a semiconductor device whose longer-side length is 3.40 mm (L1 in FIG. 2) and shorter-side length is 1.96 mm (L2 in FIG. 2).

FIG. 5A shows that the quotient of Ag layer thickness/Si layer thickness needs to be at least 1.0 to achieve an on-resistance of 2.4 mΩ or less. Based on this and the upper limit for the Ag layer thickness derived from FIG. 4B, the Ag layer thickness is desirably at least 30 µm and less than 60 µm.

On the other hand, as illustrated in FIG. 5A, when the quotient of Ag layer thickness/Si layer thickness is in the range of 1.0 and higher, the amount of warpage at 250 degrees Celsius is not 60 µm or less, which is an allowable range stipulated by, for example, JEITA.

In view of this, the Ni layer is disposed to inhibit warpage in semiconductor device 1 while ensuring the low on-resistance of semiconductor device 1. In particular, the Ag layer is disposed sandwiched between the Si layer and the Ni layer, and from the viewpoint of maintaining stress balance between both surfaces of the Ag layer, the Ni layer desirably has approximately the same physical properties and approximately the same thickness as the Si layer to inhibit the amount of warpage. However, since no such metal material exists, the Ni layer is required to at least have physical properties that are closer to the physical properties of the Si layer than the physical properties of the Ag layer. It is further desirable that the Ni layer be thicker than the Si layer from the viewpoint of maintaining stress balance between both surfaces of the Ag layer.

Table 1 shows examples of typical film thickness and physical properties for each of the Si, Ag, and Ni layers in the stacked structure, which is one example of the stacked structure of semiconductor layer 40, metal layer 31, and metal layer 30.

TABLE 1

|  | Film thickness (µm) | Young's modulus (GPa) | Coefficient of thermal expansion (ppm) | Manufacturing method |
| --- | --- | --- | --- | --- |
| Si layer | 20 (t1) | 185 (E1) | 3-5 (α1) |  |
| Ag layer | 50 (t2) | 83 (E2) | 18.9 (α2) | Electroplating |
| Ni layer | 30 (t3) | 200 (E3) | 12.8 (α3) | Electroplating |
|  | t1 < t2 | E3 > E2 | α3 < α2 |  |

As illustrated in Table 1, the Young's modulus of metal material Ni in the Ni layer is higher than the Young's modulus of the metal material Ag in the Ag layer. Moreover, the Ag layer is thicker than the Si layer. Furthermore, the coefficient of thermal expansion of the second metal material in the Ni layer is lower than the coefficient of thermal expansion of the first metal material in the Ag layer. Warpage of semiconductor device 1 from changes in temperature can be inhibited as a result of the coefficient of thermal expansion of the Ni layer being lower than the coefficient of thermal expansion of the Ag layer.

Figure 5B:
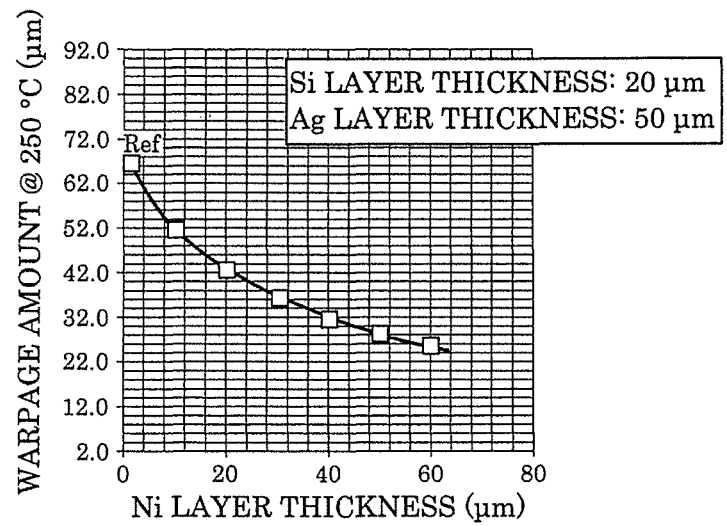
FIG. 5B illustrates a graph of amount of warpage relative to Ni layer thickness in prototypes of a semiconductor device having a stacked structure of a Si layer, a Ag layer, and a Ni layer.

FIG. 5B illustrates a graph of amount of warpage relative to Ni layer thickness in prototypes of a semiconductor device having a stacked structure of a Si layer, a Ag layer, and a Ni layer. FIG. 5B illustrates results of calculating amounts of warpage in the semiconductor device when the thickness of the Si layer is 20 µm, the thickness of the Ag layer is 50 µm, and the thickness of the Ni layer is varied.

As one can see from FIG. 5B, the greater the thickness of the Ni layer is, the more effective it is in inhibiting warpage, but when the thickness of the Ni layer exceeds approximately 10 µm, the effect of the reduction in warpage is particularly significant, and as the thickness of the Ni layer increases thereafter, the effect of the reduction in warpage converges. Thus, from the viewpoint of inhibiting warpage, an effective range for the thickness of the Ni layer is from 10 µm to 35 µm.

Note that in FIG. 5B, in the semiconductor device, longer-side length L1 of semiconductor layer 40 is 3.40 mm, shorter-side length L2 of semiconductor layer 40 is 1.96 mm, the thickness of the Si layer is 20 µm, and the thickness of the Ag layer is 50 µm. Moreover, the amount of warpage in FIG. 5B is a numerical representation of the amount of warpage at the high temperature of 250 degrees Celsius in the thermal profile for reflow soldering, which will be described later.

[4. Mounting of Semiconductor Device]

Semiconductor device 1 is mounted to the mounting substrate by arranging semiconductor device 1 facedown so that gate electrode 19, source electrodes 11, gate electrode 29, and source electrodes 21 face the mounting surface of the mounting substrate, and mounting semiconductor device 1 to the mounting substrate via a bonding material such as solder in a reflow soldering process while applying steady pressure to semiconductor device 1 (for example, applying pressure to achieve a 80 μm gap between the mounting substrate and semiconductor device 1).

Figure 6A:
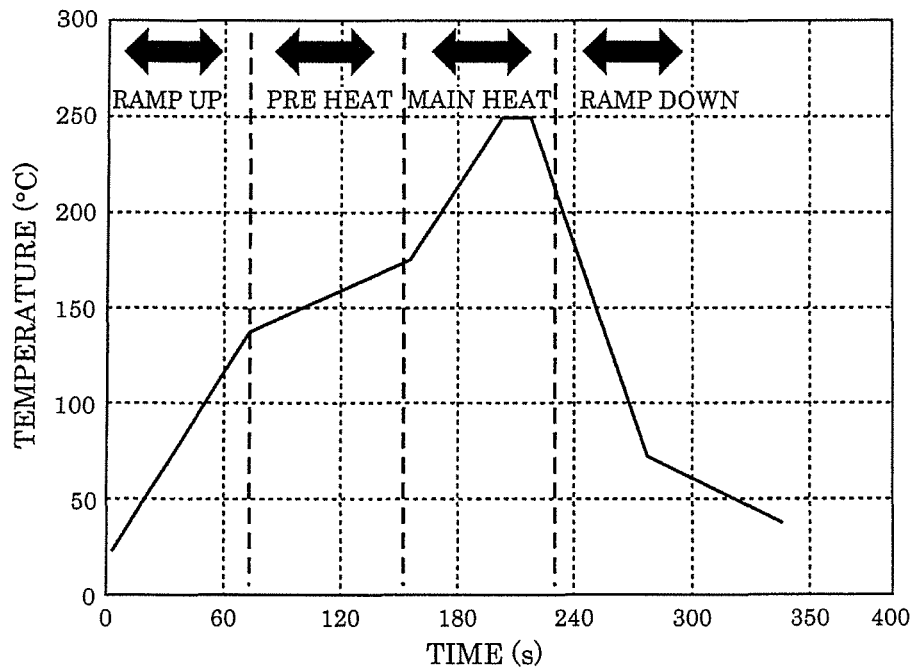
FIG. 6A illustrates one example of processes of and a thermal profile for reflow soldering of a semiconductor device according to an embodiment.

FIG. 6A illustrates one example of processes of and a thermal profile for reflow soldering of semiconductor device 1 according to an embodiment. Solder is typically used as the bonding material in reflow soldering. When mounting semiconductor device 1 using solder as the bonding material, solder is printed in predetermined locations on the mounting substrate, semiconductor device 1 is pressed facedown on the printed solder, and subjected to heat treatment in a process known as reflow soldering. In one example, the inventors performed the reflow soldering using a thermal profile like the one illustrated in FIG. 6A. In the reflow soldering processes, the solder is heated to a high-temperature of 250 degrees Celsius, which exceeds the melting temperature of solder of around 220 degrees Celsius. Thereafter, the solder is solidified in the cooling process, which hardens the joints and completes the reflow soldering. In the present disclosure, soldering using the reflow process will hereinafter be referred to as "reflow soldering". In other words, as used herein, the sequence of performing a heat treatment process of heating the solder used as the bonding material to or beyond its melting temperature and cooling the solder is collectively defined as "reflow soldering".

Note that the thermal profile illustrated in FIG. 6A is one example, and the specifications of the heat treatment are not limited to this thermal profile.

Moreover, as used in the present disclosure, warpage of the semiconductor device refers to warpage that occurs in the semiconductor device from changes in temperature, and high-temperature warpage that may cause a mounting defect. Unless otherwise noted, when the terminology "warpage" or "high-temperature warpage" is used, this refers to warpage that occurs at temperatures at or above the melting temperature of solder.

Semiconductor device 1 includes a stacked structure of the Si layer and the Ag layer. Since the coefficient of thermal expansion of metal is higher than the coefficient of thermal expansion of silicon, semiconductor device 1 can warp depending on the temperature of the environment.

Figure 6B:
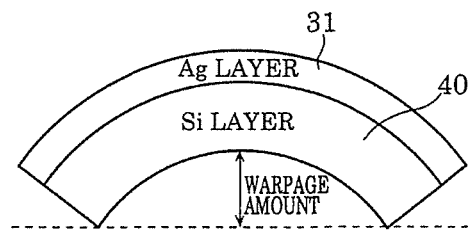
FIG. 6B is a cross-sectional schematic view of a stacked structure of a Si layer and a Ag layer, illustrating a state in which the stacked structure is warped such that the Si layer side is concave.
Figure 6C:
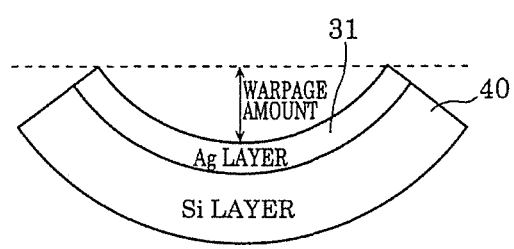
FIG. 6C is a cross-sectional schematic view of a stacked structure of a Si layer and a Ag layer, illustrating a state in which the stacked structure is warped such that the Ag layer side is concave.

FIG. 6B is a cross-sectional schematic view of the stacked structure of the Si layer and the Ag layer, illustrating a state in which the stacked structure is warped such that the Si layer side is concave. FIG. 6C is a cross-sectional schematic view of the stacked structure of the Si layer and the Ag layer, illustrating a state in which the stacked structure is warped such that the Ag layer side is concave.

Hereinafter, the warpage illustrated in FIG. 6B in which the Si layer side is concave is referred to as "positive warpage", and the warpage illustrated in FIG. 6C in which the Ag layer side is concave is referred to as "negative warpage". Moreover, as illustrated in FIG. 6B and FIG. 6C, when the stacked structure of the Si layer and the Ag layer warps, the difference in height between the lengthwise central region and the distal ends is referred to as "amount of warpage".

Figure 6D:
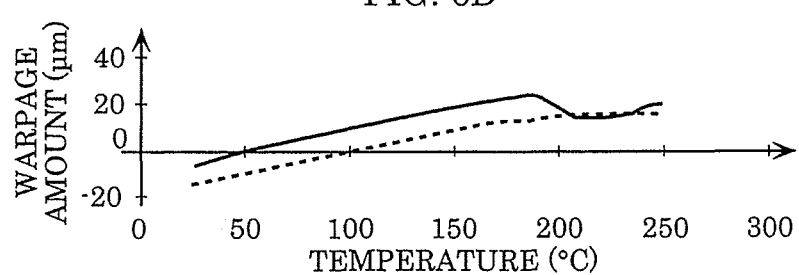
FIG. 6D is a graph illustrating the amount of warpage as a stacked structure of a Si layer and a Ag layer is heated.

FIG. 6D is a graph illustrating changes in the amount of warpage as the stacked structure of the Si layer and the Ag layer is heated. More specifically, FIG. 6D is a graph illustrating changes in the amount of warpage as the stacked structure of the Si layer and the Ag layer is heated, when longer-side length L1 is 3.40 mm, shorter-side length L2 is 1.96 mm, the thickness of the Si layer is 70 μm, and the thickness of the Ag layer is 30 μm.

In FIG. 6D, the data indicated by the solid line is data obtained when heat is initially applied to the stacked structure of the Si layer and the Ag layer, which is formed by adding the Ag layer to the Si layer by, for example, plating. Here, the direction of the warpage reverses at around 50 degrees Celsius. This is thought to be due to the temperature at the time of plating being around 50 degrees Celsius, and thus the Ag layer contracts when under 50 degrees Celsius and expands when over 50 degrees Celsius. At around 180 degrees Celsius, the amount of warpage temporarily decreases. This is thought to be due to the metal crystals in the Ag layer, which is formed by plating, re-crystallizing when the Ag layer is heated to around 180 degrees Celsius, and the physical constant relative to heat changing. Note that since such re-crystallizing of the metal is influenced not only by the components and thickness of the Ag layer, but also by, for example, the film-forming method and film-forming conditions of the Ag layer, the re-crystallizing phenomenon does not always occur for all film-forming methods and film-forming conditions.

The data indicated by the dashed line is data obtained when the stacked structure of the Si layer and the Ag layer is reheated after having been heated to 250 degrees Celsius in the initial heating and then cooled to room temperature. Unlike the graph of the data obtained when heat is initially applied, there are no undulations. This is thought to be due to the metal in the Ag layer re-crystallizing in the initial application of heat.

Based on the above data, it is known that the stacked structure of the Si layer and the Ag layer exhibits negative warpage at room temperatures no more than 50 degrees Celsius, and exhibits 20 μm to 30 μm of positive warpage at high temperatures no less than 100 degrees Celsius (for example, around the melting temperature of the solder in reflow soldering, which is from 180 to 220 degrees Celsius).

[5. Countermeasure for Joint Defects Associated with Mounting of Semiconductor Device]

Although adding the Ni layer is effective in inhibiting the warpage of semiconductor device 1, increasing the thickness of the Ag layer to 50 μm to achieve a low on-resistance and increasing the thickness of the Ni layer to 30 μm to inhibit the warpage of semiconductor device 1 greatly increases the weight of semiconductor device 1. An increase in the weight of semiconductor device 1 makes it easier for joint defects to arise when mounting semiconductor device 1, which is a problem different from the warpage of semiconductor device 1. When semiconductor device 1 is facedown mounted, if semiconductor device 1 becomes excessively heavy, the force pushing down on the solder increases, even under the same mounting conditions. This increases the likelihood of solder protruding from source electrodes 11, source electrodes 21, and the regions of the substrate electrodes formed on the mounting substrate, and causing a short circuit.

Moreover, completely eliminating warpage of semiconductor device 1 is difficult, even when the Ni layer is added. Accordingly, in order to achieve a low on-resistance, the two problems, namely the occurrence of warpage in semiconductor device 1 and the increase in weight of semiconductor device 1, must be addressed. As a result of intensive study, the inventors discovered that the above problems can be avoided by adjusting the shapes, arrangement, and total surface area of the electrodes.

Semiconductor device 1 according to the present embodiment mainly includes a Si layer, a Ag layer, and a Ni layer. In other words, the weight of semiconductor device 1 per unit surface area (first film thickness converted weight) can be calculated via the relational expression illustrated in Expression 1 below, by measuring the thickness of each layer using the weight density of each of Si, Ag, and Ni.

expressed in milligrams by applying the actual size of the semiconductor device (3.40 mm×1.96 mm: L1×L2 in FIG. 2) to the first film thickness converted weight, which is weight per unit surface area.

Moreover, the measured weight is the average weight of 20 fabricated samples of semiconductor device 1.

With Expression 2, it is possible to accurately estimate the weight of semiconductor device 1 by knowing the thickness of each layer in semiconductor device 1.

Table 2 shows the rate of occurrence of mounting defects after reflow soldering across samples of the semiconductor device including the Si layer, Ag layer, and Ni layer in various thicknesses.

TABLE 2

| | | | | | | | | | | | Rate of occurrence of mounting defects (%) | | | |
|---|---|---|---|---|---|---|---|---|---|---|---|---|---|---|
| | | | | | | Warpage amount | | | Rate of occurrence of solder protrusions exceeding standard limits | | Rate of occurrence of side- | Void rate | | |
| | Film thickness as set (μm) | | | Film thickness as measured (μm) | | | 250° C. | | No. of tests | | | | Large | Small |
| | | | | | | | (μm) | Measured | con- | Source | Gate | surface | source | source | Gate |
| Sample No. | Si layer | Ag layer | Ni layer | Si layer | Ag layer | Ni layer | Measured amount | weight (mg) | ducted | elec- trode | elec- trode | solder adhesion | elec- trodes | elec- trodes | elec- trode |
| 1 | 20 | 50 | 5 | 18.7 | 57.0 | 5.8 | 51.9 | 4.45 | 16 | 0 | 0 | 0 | 29.1 | 37.5 | 30.0 |
| 2 | — | — | 10 | 21.2 | 52.4 | 11.5 | 42.7 | 4.80 | 16 | 0 | 0 | 0 | 21.4 | 28.1 | 20.6 |
| 3 | — | — | 15 | 20.1 | 52.3 | 16.3 | 41.5 | 5.04 | 16 | 0 | 0 | 0 | 23.7 | 22.9 | 14.3 |
| 4 | — | — | 20 | 20.2 | 52.9 | 21.4 | 38.1 | 5.39 | 16 | 0 | 0 | 0 | 10.4 | 22.1 | 14.6 |
| 5 | — | — | 25 | 20.8 | 48.4 | 31.4 | 39.0 | 5.27 | 16 | 0 | 0 | 0 | 21.5 | 26.3 | 14.9 |
| 6 | — | — | 30 | 19.0 | 51.8 | 32.5 | 36.6 | 6.04 | 16 | 0 | 0 | 0 | 16.9 | 20.1 | 19.9 |
| 7 | — | — | 35 | 20.1 | 52.2 | 39.1 | 35.4 | 6.30 | 16 | 0 | 0 | 6.3 | 19.9 | 28.8 | 13.0 |
| 8 | — | — | 40 | 19.8 | 50.6 | 42.1 | 34.0 | 6.59 | 16 | 6.3 | 0 | 0 | 20.5 | 28.3 | 19.0 |
| 9 | — | — | 45 | 18.4 | 49.2 | 46.7 | 29.9 | 6.95 | 16 | 6.3 | 6.3 | 0 | 20.2 | 22.6 | 28.7 |
| 10 | — | 20 | 30 | 19.3 | 20.8 | 32.5 | 45.9 | 3.87 | 16 | 0 | 0 | 0 | 22.3 | 33.4 | 27.3 |
| 11 | — | 30 | — | 20.5 | 32.7 | 32.9 | 40.9 | 4.69 | 16 | 0 | 0 | 0 | 28.8 | 24.6 | 24.2 |
| 12 | — | 40 | — | 19.2 | 43.2 | 32.8 | 38.3 | 5.48 | 16 | 0 | 0 | 0 | 19.7 | 32.8 | 21.0 |
| 13 | — | 50 | — | 19.0 | 51.8 | 32.5 | 36.6 | 6.04 | 16 | 0 | 0 | 0 | 18.5 | 23.8 | 15.7 |
| 14 | — | 60 | — | 18.6 | 59.7 | 30.9 | 31.1 | 6.53 | 16 | 0 | 0 | 6.3 | 16.9 | 20.1 | 19.9 |
| 15 | — | 70 | — | 19.6 | 74.7 | 32.5 | 31.0 | 7.67 | 16 | 6.3 | 0 | 0 | 29.8 | 16.4 | 19.6 |

(MATH. 1)

$$\text{First film thickness converted weight} = 2.33 \times t_{si} + 10.5 \times t_{ag} + 8.90 \times t_{ni} \quad \text{(Expression 1)}$$

Note that in Expression 1, $t_{si}$ is the thickness (μm) of semiconductor layer 40 (the Si layer), $t_{ag}$ is the thickness (μm) of metal layer 31 (the Ag layer), and $t_{ni}$ is the thickness (μm) of metal layer 30 (the Ni layer). Moreover, 2.33 (g/cm³), 10.5 (g/cm³), and 8.90 (g/cm³), are the respective weight densities of Si, Ag, and Ni. Note that the first film thickness converted weight in Expression 1 has a strong correlation to measured weight. Furthermore, the first film thickness converted weight in Expression 1 can be converted into a second film thickness converted weight (mg) via Expression 2 below.

(MATH. 2)

$$\text{Second film thickness converted weight (mg)} = 0.0067 \times (2.33 \times t_{si} + 10.5 \times t_{ag} + 8.90 \times t_{ni}) \quad \text{(Expression 2)}$$

In other words, the coefficient (0.0067) in Expression 2 is for converting the first film thickness converted weight obtained in Expression 1 into units of milligrams by measuring the thickness of each layer in semiconductor device 1 and using the weight density in (g/cm3) units. More specifically, the second film thickness converted weight is Mounting defects after reflow soldering were determined with focus on the following three defects.

(1) Defect whereby solder protrudes out of the perimeter of an electrode.

(2) One type of solder protrusion defect whereby the protruding solder jumps out of the perimeter of an electrode as a floating ball of solder or the protruding solder is fixed on the side surface portion of the semiconductor device in a semispherical shape.

(3) Defect whereby solder that desirably should cover an entire predetermined region fails to cover a portion of the region. These were counted as a void rate and void occurrence rate.

Note that void rate is numerically represented for each electrode in the semiconductor device, based on the computation formula of Expression 3.

(MATH. 3)

$$\text{Void rate (\%)} = \text{void surface area} / \text{electrode surface area} \quad \text{(Expression 3)}$$

Moreover, in accordance with the IPC-7095 standard, the severity of the occurrence of voids is classified from Class I to Class III depending on the magnitude of the void rate. Void occurrence rate is an evaluation expressed as the rate (in percentage) of occurrence of electrodes classified as Class I, and the rate (in percentage) of occurrence of electrodes classified as Class II.

It is extremely difficult to completely prevent solder protrusion and void occurrence. Moreover, since minor solder protrusions or voids have little to no effect on the function of the product, in Table 2, only major solder protrusions or voids that lead to critical defects such as those that cause an open circuit or a short circuit are subject to a failing score.

Accordingly, defects based on the state of the solder in the semiconductor device are determined using the following criteria.

(A) Solder protrusion: determined to be a defect if solder protrudes more than half way to an adjacent electrode.
(B) Solder ball; side-surface solder adhesion: determined to be a defect if occurrence is confirmed.
(C) Void rate: void rate is calculated for each electrode in the semiconductor device, and a defect is determined if, in accordance with the IPC-7095 standard, the void rate is 33% or higher, which exceeds the Class I criteria.

In the samples (semiconductor devices) shown in Table 2, longer-side length L1 of the Si layer is 3.40 mm, and shorter-side length L2 of the Si layer is 1.96 mm. Moreover, the layout of source electrodes 11, source electrodes 21, gate electrode 19, and gate electrode 29 is the same as the layout illustrated in (a) in FIG. 2. In Table 2, "large source electrodes" corresponds to source electrodes 11$a$, 11$d$, 21$a$, and 21$d$ having large surface areas among the all source electrodes illustrated in (a) in FIG. 2, and "small source electrodes" corresponds to source electrodes 11$b$, 11$c$, 21$b$, and 21$c$ having small surface areas among all source electrodes illustrated in (a) in FIG. 2.

Note that in Table 2, values that do not satisfy the criteria (A) through (C) described above (i.e., values indicating a defect) are shown in bold font.

According to Table 2, one can see that the measured weight of semiconductor device 1 increases and the amount of warpage decreases with an increase in the thickness of the Ag layer or Ni layer. Moreover, depending on the situation of the mounting defect, the following trends appear.

(i) The measured weight decreases, the amount of warpage increases, and the void rate increases with a decrease in the thickness of the Ag layer or the Ni layer, but no solder protrusion defects, solder ball defects, or side-surface solder adhesion defects occur.

(ii) The measured weight increases, the amount of warpage decreases, and the occurrence rate of solder protrusion defects and side-surface solder adhesion defects increase with an increase in the thickness of the Ag layer or the Ni layer, but no void defects occur.

The two trends described in (i) and (ii) above can be explained as follows.

Figure 7:
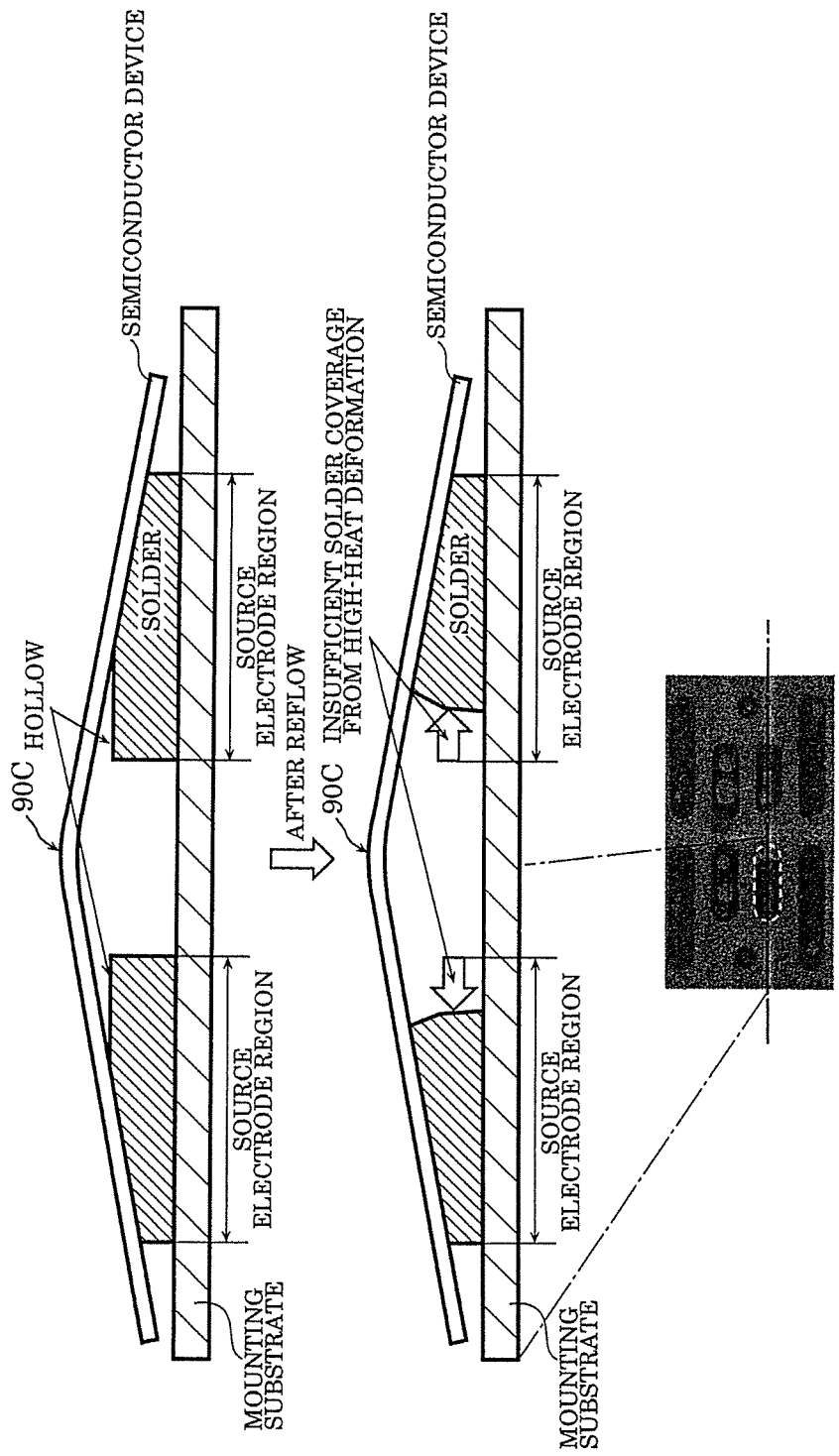
FIG. 7 includes a cross-sectional schematic view of a semiconductor device having a stacked structure of a Si layer, a Ag layer, and a Ni layer, illustrating the relationship between warpage in the semiconductor device and electrode surface solder bump formation, and an X-ray image showing insufficient coverage by solder due to warpage.

FIG. 7 includes a cross-sectional schematic view of a semiconductor device having a stacked structure of a Si layer, a Ag layer, and a Ni layer, illustrating the relationship between warpage in the semiconductor device and electrode surface solder bump formation, and an X-ray image showing insufficient coverage by solder due to warpage. Note that in the present embodiment, the solder bumps are LGA (Land Grid Array) solder bumps, but the solder bumps may be BGA (Ball Grid Array) solder bumps. The bump type is not limited.

In the case of (i) above, solder protrusion defects do not occur since not enough weight is placed on the electrodes to push the solder out. However, as illustrated in FIG. 7, as a result of the high amount of warpage, the distance between the electrodes and mounting substrate increases in the central region of the Si layer in a plan view due to the high-temperature positive warpage during reflow soldering, and on the boundary line 90C sides of source electrodes 11 and source electrodes 21, there are regions that solder does not sufficiently cover (insufficient coverage by solder). Such regions are calculated as voids.

In the case of (ii) above, since there is a low amount of warpage of the semiconductor device, insufficient coverage by solder like that illustrated in FIG. 7 does not occur. Conversely, as a result of the heavy weight of the semiconductor device, solder protrusion defects increase.

In Table 2, the thickness of the Ag layer that satisfies the criteria (A) (rate of occurrence of solder protrusion that exceeds standard limits is 0%), (B) (rate of occurrence of side-surface solder adhesion is 0%), and (C) (void rate is less than 33%) above is a thickness of at least 30 μm and less than 60 μm. Moreover, in Table 2, the thickness of the Ni layer that satisfies the criteria (A) (rate of occurrence of solder protrusion that exceeds standard limits is 0%), (B) (rate of occurrence of side-surface solder adhesion is 0%), and (C) (void rate is less than 33%) above is a thickness of at least 10 μm and less than 35 μm.

Figure 8:
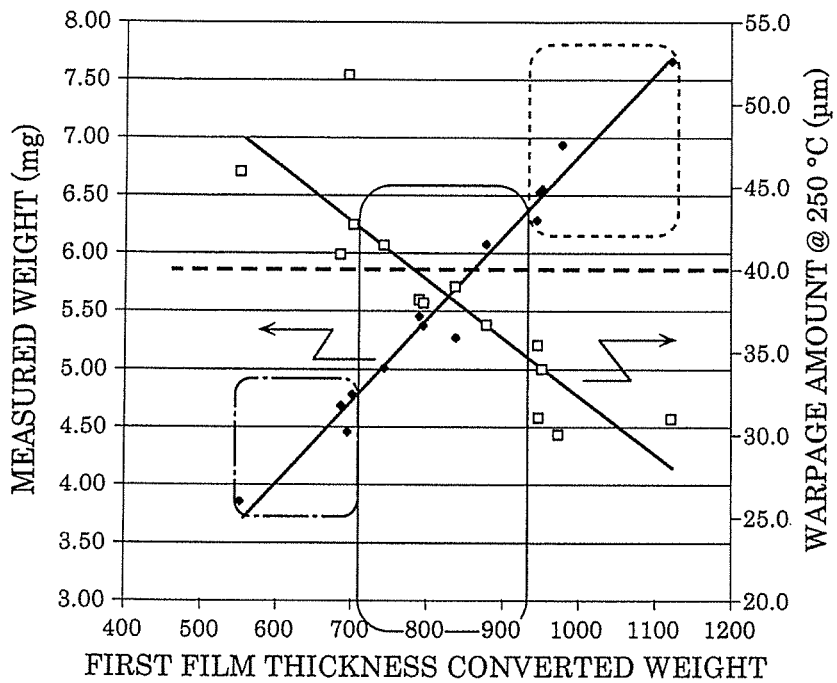
FIG. 8 is a graph illustrating the measured weight and the amount of warpage relative to first film thickness converted weight in a semiconductor device having a stacked structure of a Si layer, a Ag layer, and a Ni layer.

FIG. 8 is a graph illustrating the measured weight and the amount of warpage relative to the first film thickness converted weight in a semiconductor device having a stacked structure of a Si layer, a Ag layer, and a Ni layer. FIG. 8 is a visual representation of the trends of (i) and (ii) in Table 2. In the graph in FIG. 8, the first film thickness converted weight of the semiconductor device calculated using Expression 1 is represented on the horizontal axis, the measured weight of the semiconductor device is represented on the left vertical axis, and the amount of warpage of the semiconductor device is represented on the right vertical axis.

In FIG. 8, the region enclosed by the dotted and dashed line indicates the region in which void related defects that exceed standard limits occur, and the region enclosed by the dashed line indicates the region in which solder protrusion related defects that exceed standard limits occur. Since the region enclosed by the dotted and dashed line indicates defects caused by the warpage of the semiconductor device, it is biased toward the left side of the graph (where the weight is low). On the other hand, since the region enclosed by the dashed line indicates defects caused by the weight of the semiconductor device, it is biased toward the right side of the graph (where the weight is high).

In other words, the range in which solder joint defects caused by the warpage and weight of the semiconductor device can be avoided is the range outside of the dotted and dashed line and the dashed line in FIG. 8. From the correlation shown in FIG. 8, the range in which solder joint defects caused by the mounting of the semiconductor device do not occur is the range in which the first film thickness converted weight of Expression 1 is greater than 702 and less than 943. In other words, semiconductor device 1 according to the present embodiment satisfies Expression 4 below.

(MATH. 4)

$$702 < 2.33 \times t_{si} + 10.5 \times t_{ag} + 8.90 \times t_{ni} < 943 \quad \text{(Expression 4)}$$

Note that the amount of warpage of semiconductor device 1 desirably does not exceed a permissible amount (for example, approximately 40 μm), Note that this permissible amount of warpage (40 μm) is arrived at based on a reference point of 60 μm, which is a permissible amount stipulated in a standard such as JEITA, and further taking into consideration a manufacturing margin of error (for example, 1.5 times) (i.e., a value obtained by dividing 60 μm by 1.5). Looking at FIG. 8, the point at which the amount of warpage of the semiconductor device reaches 40 μm is at a first film thickness converted weight of 790, indicated on the horizontal axis. In other words, in order to prevent the amount of warpage of semiconductor device 1 from exceeding 40 μm, it is desirable that semiconductor device 1 satisfies Expression 5.
(MATH. 5)

$$790 \leq 2.33 \times t_{si} + 10.5 \times t_{ag} + 8.90 \times t_{ni} \quad \text{(Expression 5)}$$

Satisfying the above makes it possible to keep the amount of warpage at 40 μm or less.

Next, the ratio of longer-side length L1 and shorter-side length L2 of semiconductor device 1 will be described. The amount of warpage and weight of semiconductor device 1 changes depending on element size. Element size is determined depending on the application, but in applications for protection of a lithium ion battery circuit used in a smartphone, it is necessary for the circuit substrate to be houseable in the communications device, thickness-wise. Moreover, the amount of warpage increases with an increase in the aspect ratio (longer-side length L1/shorter-side length L2 of the Si layer) of semiconductor device 1. With the intent of studying the relationship between the warpage of semiconductor device 1 and mounting defects, the inventors considered a semiconductor device 1 having a large aspect ratio but still of a size that could fit in the circuit substrate. Specifically, the inventors considered a 3.40 mm (longer-side length L1)×1.96 mm (shorter-side length L2) semiconductor device 1. Assuming the above aspect ratio (1.73) of semiconductor device 1 is the maximum aspect ratio, the aspect ratio is 1.73 or less.

Next, the perimeter length of semiconductor device 1 will be described. Before the solder, which is the bonding material, melts, flux contained in the solder begins volatizing. This is tied to the protrusion of the solder. Flux is included in advance in solder to enhance the wettability of the solder, much like a lubricant. Most solder includes flux.

Volatile flux first expands as an air bubble inside the solder, and if even part of the expanded bubble contacts the boundary between the solder and the outside environment, the flux releases out of the solder and dissipates, like gas leaking from a balloon with a small hole in it. If there is no chance for the volatile flux bubble to contact the boundary between the solder and the outside environment, the expanding bubble not only remains within the solder, but pushes aside the surrounding solder. This accelerates or triggers solder protrusion. Accordingly, it is desirable to facilitate the volatile flux bubble to contact the boundary between the solder and the outside environment and release out of the solder.

Based on this knowledge, shortening the lengths of the shorter sides of the approximately rectangular source electrodes 11 and source electrodes 21 is effective. This is because bubbles will contact the outside of the solder earlier and release if the shorter sides are shortened, since volatile flux bubbles expand evenly in a spherical shape inside the solder. However, shortening the shorter sides means reducing the surface area of each electrode, which negatively affects the on-resistance of semiconductor device 1.

Table 3 shows states of solder after reflow soldering across samples of the semiconductor device with various electrode layout configurations. Moreover, FIG. 9 illustrates variations of electrode layout configurations in semiconductor device 1 according to an embodiment.

Note that in the prototype tests in Table 2 described above, the layout configuration of reference 1 is used, and film thicknesses are varied (the column labeled "sample no." in Table 2 indicates that a plurality of samples were used in the prototype tests) to test dependency of solder joint defects on the thicknesses of the Si layer, the Ag layer, and the Ni layer. On the other hand, in the prototype tests in Table 3, the layout configuration of the source electrodes is varied (prototype tests were conducted by varying the layout configuration to the configurations indicated by references 1 through 7 in FIG. 9; hereinafter, each layout configuration is referred to as one of references 1 through 7) to test dependency of solder joint defects on electrode layout.

Figure 9:
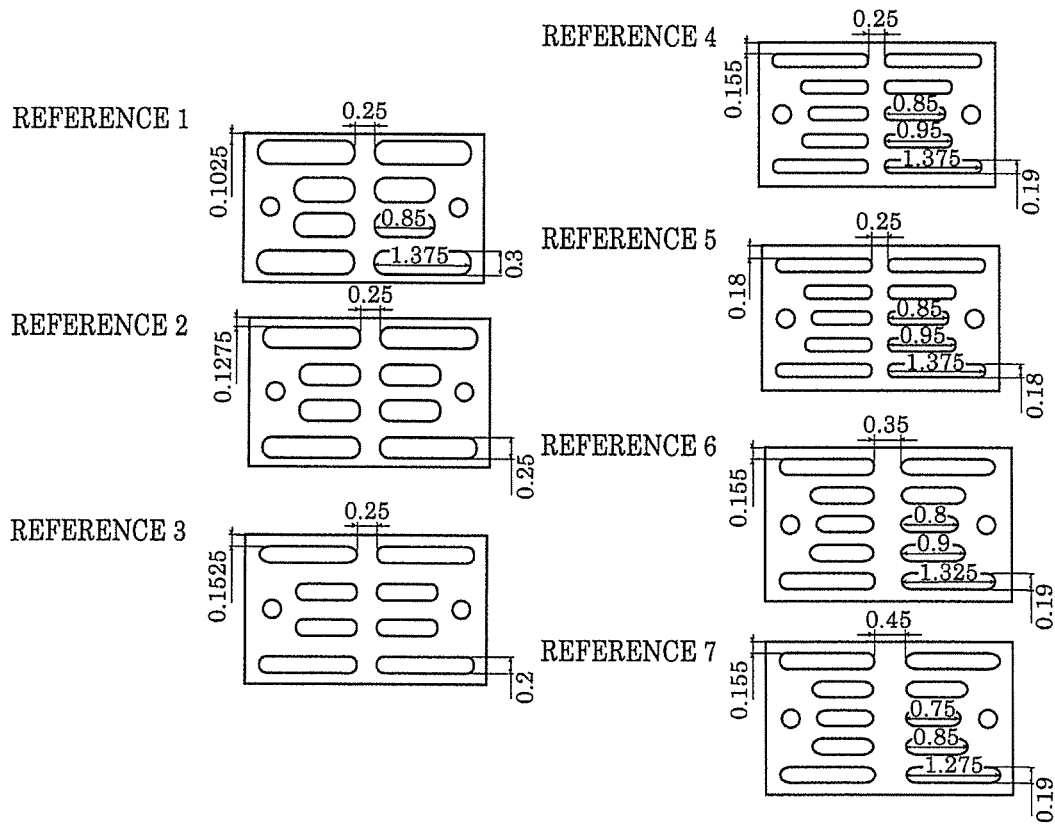
FIG. 9 illustrates variations of electrode layout configurations in a semiconductor device according to an embodiment.

As illustrated in Table 3 and FIG. 9, in references 1 through 3, the surface electrode widths and the longer-side margins (as used herein, the longer-side margin is the distance between source electrodes 11 and 21 and a longer side of the Si layer) are varied. Moreover, in references 4 through 7, the number of source electrodes is increased in correlation with the amount of further reduction in the widths of the source electrodes, to keep the total surface area of the source electrodes the same with the intent of maintaining a constant on-resistance. In reference 4 and 5, the source electrode widths and the longer-side margins are further varied. Moreover, in references 6 through 7, compared to reference 4, the source electrode widths and the longer-side margins are kept constant while the layout of the source electrodes in the direction along the longer side of the Si layer is varied and spacing between source electrodes across the boundary line and the lengths of the source electrodes are varied. In reference 6, the spacing between source electrodes across the boundary line is 0.35 mm, in reference 7, the spacing between source electrodes across the boundary line is 0.45 mm, and in each of references 1 through 5, the spacing between source electrodes across the boundary line is 0.25 mm.

TABLE 3

| | Thickness as set (μm) | | | Thickness as measured (μm) | | | Warpage amount 250° C. (μm) | Measured weight (average of 20 samples) | Rate of occurrence of mounting defects (%) | | | Side-surface solder adhesion | Determination (PASS/FAIL) |
|---|---|---|---|---|---|---|---|---|---|---|---|---|---|
| | | | | | | | | | Protrusion (S) | Protrusion (G) | | | |
| | | | | | | | | | Exceeding standard limits | Within standard limits | Exceeding standard limits | | |
| Reference | Si | Ag | Ni | Si | Ag | Ni | Measurement | (mg) | | | | | |
| 1 | 20 | 50 | 30 | 19.0 | 51.8 | 32.5 | 36.6 | 6.04 | 0 | 0 | 0 | 0 | P |
| | 20 | 60 | 30 | 18.6 | 59.7 | 30.9 | 32.3 | 6.53 | 0 | 0 | 0 | 6.3 | F |
| | 20 | 70 | 30 | 19.6 | 74.7 | 32.5 | 31.0 | 7.67 | 6.3 | 0 | 0 | 0 | F |

TABLE 3-continued

| | | | | | | | | | | | | | |
|---|---|---|---|---|---|---|---|---|---|---|---|---|---|
| 2 | 20 | 50 | 30 | 19.4 | 49.4 | 32.1 | 31.1 | 5.99 | 6.3 | 0 | 0 | 0 | F |
| | 20 | 60 | 30 | 19.1 | 61.2 | 32.8 | 32.3 | 6.94 | 3.1 | 6.3 | 0 | 0 | F |
| | 20 | 70 | 30 | 19.6 | 71.1 | 30.8 | 31.6 | 7.55 | 0 | 4.3 | 0 | 4.3 | F |
| 3 | 20 | 50 | 30 | 19.4 | 49.4 | 32.1 | 31.1 | 5.99 | 0 | 0 | 0 | 0 | P |
| | 20 | 60 | 30 | 19.1 | 61.2 | 32.8 | 32.3 | 6.94 | 0 | 12.5 | 0 | 0 | P |
| | 20 | 70 | 30 | 19.6 | 71.1 | 30.8 | 31.6 | 7.55 | 0 | 18.2 | 0 | 0 | P |
| 4 | 20 | 50 | 30 | 19.4 | 49.4 | 32.1 | 31.1 | 5.99 | 0 | 0 | 0 | 0 | P |
| | 20 | 60 | 30 | 19.1 | 61.2 | 32.8 | 32.3 | 6.94 | 3.1 | 6.3 | 0 | 0 | F |
| | 20 | 70 | 30 | 19.6 | 71.1 | 30.8 | 31.6 | 7.55 | 3.1 | 3.1 | 0 | 0 | F |
| 5 | 20 | 50 | 30 | 19.4 | 49.4 | 32.1 | 31.1 | 5.99 | 0 | 6.3 | 0 | 0 | P |
| | 20 | 60 | 30 | 19.1 | 61.2 | 32.8 | 32.3 | 6.94 | 0 | 15.6 | 0 | 0 | P |
| | 20 | 70 | 30 | 19.6 | 71.1 | 30.8 | 31.6 | 7.55 | 0 | 18.2 | 0 | 0 | P |
| 6 | 20 | 50 | 30 | 19.4 | 49.4 | 32.1 | 31.1 | 5.99 | 0 | 6.3 | 0 | 0 | P |
| | 20 | 60 | 30 | 19.1 | 61.2 | 32.8 | 32.3 | 6.94 | 0 | 12.5 | 0 | 0 | P |
| | 20 | 70 | 30 | 19.6 | 71.1 | 30.8 | 31.6 | 7.55 | 0 | 18.8 | 0 | 0 | P |
| 7 | 20 | 50 | 30 | 19.4 | 49.4 | 32.1 | 31.1 | 5.99 | 0 | 12.5 | 0 | 0 | P |
| | 20 | 60 | 30 | 19.1 | 61.2 | 32.8 | 32.3 | 6.94 | 0 | 6.3 | 0 | 0 | P |
| | 20 | 70 | 30 | 19.6 | 71.1 | 30.8 | 31.6 | 7.55 | 0 | 8.7 | 0 | 0 | P |

| Reference | 2nd film thickness converted weight M' (mg) | M'/$S_a$ | Electrodes | Longer-side length (mm) | Shorter-side length (mm) | Surface area S (mm²) | Perimeter length L (mm) | S/L | No. of electrodes | Total electrode surface area $S_a$ (mm²) | Longer-side margin (mm) |
|---|---|---|---|---|---|---|---|---|---|---|---|
| 1 | 5.69 | 2.18 | S1 | 1.375 | 0.30 | 0.393 | 3.09 | 0.127 | 4 | 2.61 | 0.103 |
| | 6.33 | 2.42 | S2 | 0.85 | 0.30 | 0.236 | 2.04 | 0.115 | 4 | | |
| | 7.50 | 2.87 | G | | 0.25 | 0.049 | 0.79 | 0.063 | 2 | | |
| 2 | 5.69 | 2.57 | S1 | 1.375 | 0.25 | 0.330 | 3.04 | 0.109 | 4 | 2.22 | 0.128 |
| | 6.55 | 2.96 | S2 | 0.85 | 0.25 | 0.199 | 1.99 | 0.100 | 4 | | |
| | 7.14 | 3.22 | G | | 0.25 | 0.049 | 0.79 | 0.063 | 2 | | |
| 3 | 5.69 | 3.15 | S1 | 1.375 | 0.20 | 0.266 | 2.98 | 0.089 | 4 | 1.81 | 0.153 |
| | 6.55 | 3.62 | S2 | 0.85 | 0.20 | 0.161 | 1.93 | 0.084 | 4 | | |
| | 7.14 | 3.95 | G | | 0.25 | 0.049 | 0.79 | 0.063 | 2 | | |
| 4 | 5.69 | 2.70 | S1 | 1.375 | 0.19 | 0.254 | 2.97 | 0.085 | 4 | 2.11 | 0.155 |
| | 6.55 | 3.10 | S2 | 0.95 | 0.19 | 0.173 | 2.12 | 0.082 | 4 | | |
| | 7.14 | 3.38 | S3 | 0.85 | 0.19 | 0.154 | 1.92 | 0.080 | 2 | | |
| | | | G | | 0.25 | 0.049 | 0.79 | 0.063 | 2 | | |
| 5 | 5.69 | 2.83 | S1 | 1.375 | 0.18 | 0.241 | 2.96 | 0.081 | 4 | 2.01 | 0.180 |
| | 6.55 | 3.26 | S2 | 0.95 | 0.18 | 0.164 | 2.11 | 0.078 | 4 | | |
| | 7.14 | 3.56 | S3 | 0.85 | 0.18 | 0.146 | 1.91 | 0.077 | 2 | | |
| | | | G | | 0.25 | 0.049 | 0.79 | 0.063 | 2 | | |
| 6 | 5.69 | 2.82 | S1 | 1.325 | 0.19 | 0.244 | 2.87 | 0.085 | 4 | 2.02 | 0.155 |
| | 6.55 | 3.25 | S2 | 0.90 | 0.19 | 0.163 | 2.02 | 0.081 | 4 | | |
| | 7.14 | 3.54 | S3 | 0.80 | 0.19 | 0.144 | 1.82 | 0.079 | 2 | | |
| | | | G | | 0.25 | 0.049 | 0.79 | 0.063 | 2 | | |
| 7 | 5.69 | 2.96 | S1 | 1.275 | 0.19 | 0.235 | 2.77 | 0.085 | 4 | 1.92 | 0.155 |
| | 6.55 | 3.41 | S2 | 0.85 | 0.19 | 0.154 | 1.92 | 0.080 | 4 | | |
| | 7.14 | 3.72 | S3 | 0.75 | 0.19 | 0.135 | 1.72 | 0.078 | 2 | | |
| | | | G | | 0.25 | 0.049 | 0.79 | 0.063 | 2 | | |

Next, among the electrode layout variations in Table 3, references 1 through 3 having the same type of electrode layout configuration as that illustrated in (a) in FIG. 2 will be described. The shorter-side length of each source electrode is 0.30 mm in reference 1, the shorter-side length of each source electrode is 0.25 mm in reference 2, and the shorter-side length of each source electrode is 0.20 mm in reference 3.

Figure 10:
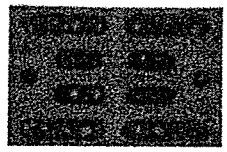
FIG. 10 illustrates X-ray images showing voids in electrode surfaces after mounting of a semiconductor device having a stacked structure of a Si layer, a Ag layer, and a Ni layer.
Figure 10:
Figure 10:
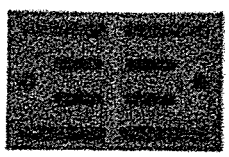

FIG. 10 illustrates X-ray images showing voids in electrode surfaces after mounting of the semiconductor device 1 (references 1 through 3). First of all, FIG. 10 shows that voids of various sizes form locally in the electrodes in semiconductor device 1. Regarding source electrodes 11 or source electrodes 21, the diameter of voids that remain in the solder decreases in order from the reference with the largest shorter-side length to the reference with the shortest shorter-side length (first reference 1, then reference 2, and finally reference 3). Regarding source electrodes 11 or source electrodes 21, with longer shorter-side lengths, there is less of a chance for the internal volatile flux bubbles to contact the boundary between the solder and the outside environment. Accordingly, in such cases, not only does the void rate increase, but solder protrusions that exceed standard limits occur resulting in the determination of defective.

Based on the results of references 1 through 3 in Table 3, the length of each shorter side of source electrodes 11 and source electrodes 21 is at most 0.3 mm and more desirably at most 0.2 mm. Note that among references 1 through 3, little to no difference in on-resistance was observed.

Next, the relationship between the weight of semiconductor device 1 and the force applied to the side surfaces of the solder bumps in semiconductor device 1 will be described.

Figure 11:
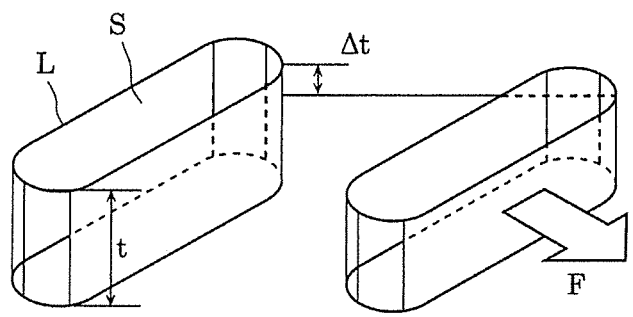
FIG. 11 illustrates force applied to the side surface of a solder bump during reflow soldering.

FIG. 11 illustrates force applied to the side surface of a solder bump during reflow soldering. In FIG. 11, a solder bump before and after reflow soldering is shown. When the height of the solder bump before reflow soldering (i.e., the distance between the mounting substrate and semiconductor device 1) is expressed as t, and the solder bump is pressed down by an amount $\Delta t$ (settle amount) during reflow soldering, the height of the solder bump after reflow soldering is (t−$\Delta t$). Here, force F applied to the solder bump on the side surface of the solder bump is expressed as shown in Expression 6, where S is electrode surface area in a plan view of the solder bump and L is electrode perimeter length.

[MATH. 6]

$$F \propto \frac{\Delta t \cdot s}{(t - \Delta t) \cdot L} \quad \text{(Expression 6)}$$

In Expression 6, Δt×S is the volume of the amount that the solder settled in the reflow soldering. This volume is compressed in the solder bump having the height (t−Δt). Here, the surface area (t−Δt)×L of the side surface of the solder bump is proportional to the surface tension of the solder bump trying to withstand the compressed solder trying to expand. Moreover, Expression 6 transforms as shown in Expression 7.

[MATH. 7]

$$F \propto \frac{S}{L} \cdot \frac{\Delta t}{(t - \Delta t)} \quad \text{(Expression 7)}$$

In order to prevent solder protrusion after reflow soldering, Expression 7 suggests properly adjusting the shape of the electrodes so as to reduce force F acting on the solder bump, by using S/L (the quotient of electrode surface area S divided by electrode perimeter length L). However, excessively reducing the electrode surface area has the negative effect that on-resistance increases.

Note that since it is the weight of semiconductor device 1 which affects settle amount Δt, reducing the weight of semiconductor device 1 effectively reduces Δt, which makes it possible to keep force F, which is the force that acts on the solder bump and promotes solder protrusion, small.

Based on Expression 6 and Expression 7, in order to inhibit solder protrusion, S/L is desirably reduced within a range that does not excessively increase on-resistance. Referring to Table 3, S/L is greatest at 0.127 in reference 1. Since solder protrusion improves from reference 1 to 2 to 3, in semiconductor device 1 according to the present embodiment, S/L is at most 0.127.

Next, the relationship between the total surface area of all electrode pads and solder protrusion will be described. When the total surface area of all electrode pads increases and thus the amount of solder used in the mounting of semiconductor device 1 increases, it can be said that, even in semiconductor devices 1 having the same amount of warpage and same Δt, the rate at which solder protrusion occurs increases.

Accordingly, a smaller total electrode surface area $S_a$, which is the cumulative surface area of all electrodes included in semiconductor device 1, is more suitable for preventing solder protrusion. In Table 3, the value of total electrode surface area $S_a$ is given for each of the layouts of references 1 through 3. Total electrode surface area $S_a$ is greatest at 2.61 mm² in reference 1. Since solder protrusion improves from reference 1 to 2 to 3, in semiconductor device 1 according to the present embodiment, total electrode surface area $S_a$ is at most 2.61 mm².

Moreover, the electrode layouts of references 1 through 7 in Table 3 are designed so as to produce the same on-resistance in semiconductor device 1. For example, if the total electrode surface area $S_a$ is too small, the on-resistance increases. FIG. 9 illustrates the electrode layouts and dimensions of references 1 through 7. Note that in the tests for checking the state of the solder after mounting, the thickness of the Si layer is 20 μm, the thickness of the Ag layer is 50 μm, and the thickness of the Ni layer is 30 μm for all references 1 through 7.

When semiconductor device 1 warps in reflow soldering, the distance between the mounting substrate and semiconductor device 1 in the direction along the longer side of the Si layer is greater in the vicinity of boundary line 90C than in the vicinity of shorter side 93 and the vicinity of shorter side 94. Accordingly, in source electrodes 11 and source electrodes 21, whose lengthwise direction is the direction along the longer side of the Si layer, molten solder pushed in the vicinity of shorter side 93 or shorter side 94 flows toward boundary line 90C along the lengthwise direction. Accordingly, solder protrusion defects or void defects caused by insufficient coverage by solder are inhibited.

Here, we will focus on reference 1, which has a typical electrode layout among references 1 through 7. From the perspective of inhibiting the void defects described above, it is important that each of source electrodes 11 and source electrodes 21 has an approximately rectangular shape that extends in the lengthwise direction of the Si layer. In reference 1, the minimum lengthwise direction length of source electrodes 11 and source electrodes 21 is 0.85 mm, and the maximum lengthwise direction length of source electrodes 11 and source electrodes 21 is 1.375 mm. Since it was confirmed reference 1 has little to no negative effect on on-resistance, source electrodes 11 and source electrodes 21 are desirably disposed in a striped pattern such that the longer sides of each individual electrode are parallel to the longer sides of the Si layer, and the length of the longer sides of each individual electrode are desirably at least 0.85 mm and at most 1.375 mm.

With this, during reflow soldering, solder can more easily flow in the lengthwise direction of the electrodes, which inhibits solder protrusion defects and void defects caused by insufficient coverage by solder.

Note that the mechanism that inhibits solder protrusion in regard to gate electrode 19 and gate electrode 29 is the same as that of source electrodes 11 and source electrodes 21. In other words, since force F that acts on the solder bumps and attempts to push solder outward is proportional to S/L, where S is the electrode surface area of the gate electrode and L is the electrode perimeter length of the gate electrode, a smaller S L value is preferable.

In Table 3, in references 1 through 7, gate electrode 19 and gate electrode 29 have the shape of a circle having a diameter of 0.25 mm, or, although not stated in Table 3, have a width of 0.25 mm in the direction along the shorter side of Si layer. In the results in Table 3, no solder protrusion that exceeds standard limits was observed in the gate electrode. Accordingly, the width of each of gate electrode 19 and gate electrode 29 is desirably no more than 0.25 mm.

Moreover, since little conducting current is necessary to perform control operations, the electrode layout is designed such that, compared to source electrodes 11 and source electrodes 21, the number of electrodes included in gate electrode 19 and gate electrode 29 and the total electrode surface area of gate electrode 19 and gate electrode 29 is small. Regardless, gate electrode 19 and gate electrode 29 should be designed so as to avoid open-circuit defects and variations in conductive impedance caused by voids in bonding portions. Accordingly, when semiconductor device 1 warps, on the assumption that warpage typical occurs one-dimensionally along the lengthwise direction of Si layer, gate electrode 19 and gate electrode 29 are desirably disposed proximate shorter side 93 and shorter side 94 of the Si layer, respectively. Furthermore, gate electrode 19 and gate electrode 29 are preferably formed adjacent to shorter side 93 and shorter side 94 of Si layer, respectively, and spaced apart from source electrodes 11 and source electrodes 21, respectively.

This makes it possible to inhibit open-circuit defects and variations in conductive impedance caused by voids in bonding portions in gate electrode 19 and gate electrode 29.

In applications in which semiconductor device 1 is used for protection of a lithium ion battery circuit used in a mobile communications device such as a smartphone, it is necessary to house the circuit substrate in the thin communications device. In view of this, the inventors considered a 3.40 mm (longer-side length L1)×1.96 mm (shorter-side length L2) semiconductor device 1. Accordingly, shorter-side length L2 of semiconductor device 1 is desirably less than 2.00 mm. Moreover, for achieving a low on-resistance, the thickness of semiconductor layer 40 (the Si layer) is desirably approximately 20 μm, and for inhibiting warpage in semiconductor device 1, the thickness of metal layer 30 (the Ni layer) is preferably greater than 15 μm.

This allows for applications in which semiconductor device 1 is used for protection of a lithium ion battery circuit in a mobile communications device such as a smartphone.

Table 3 shows the values for electrode surface area S, electrode perimeter length L, and S/L for each of references 1 through 7. Moreover, one can see that the solder state after mounting improves as the reference number increases. Conceivably, this is because, for example, from reference 1 to reference 2, the S/L value of each electrode decreases from approximately 0.12 to approximately 0.10, meaning the force that attempts to push solder out (force F acting on the solder bumps) reduces. Accordingly, when the thickness of the Si layer is approximately 20 μm, the thickness of the Ag layer is approximately 50 μm, and the thickness of the Ni layer is approximately 30 μm, the ratio of the surface area and the perimeter length of each electrode included in source electrodes 11 and source electrodes 21 is desirably less than 0.10.

This makes it possible to reduce the force that attempts to push solder so as to protrude out (force F acting on the solder bumps).

Note that the thickness of the Si layer being approximately 20 μm means that the thickness of the Si layer is essentially equal to 20 μm and, more specifically, means that the thickness of the Si layer is in a range of 20 μm±8%. Moreover, the thickness of the Ag layer being approximately 50 μm means that the thickness of the Ag layer is essentially equal to 50 μm and, more specifically, means that the thickness of the Ag layer is in a range of 50 μm±14%. Moreover, the thickness of the Ni layer being approximately 30 μm means that the thickness of the Ni layer is essentially equal to 30 μm and, more specifically, means that the thickness of the Ni layer is in a range of 30 μm±10%.

Moreover, the ratio of the surface area and the perimeter length of each electrode included in source electrodes 11 and source electrodes 21 being desirably less than 0.10 can be restated as Expression 8, where Xs is the length of the longer sides of each electrode included in source electrodes 11 and source electrodes 21, and Ys is the length of the shorter sides of each electrode included in source electrodes 11 and source electrodes 21.

[MATH. 8]

$$\frac{S}{L} = \frac{Xs \cdot Ys}{2 \cdot (Xs + Ys)} < 0.10 \quad \text{(Expression 8)}$$

Expression 9 is satisfied when Expression 8 is expanded.

[MATH. 9]

$$Xs < \frac{Ys}{5.00 \cdot Ys - 1} \quad \text{(Expression 9)}$$

With this, it is possible to inhibit the force that attempts to push solder so as to protrude out (force F acting on the solder bumps) by designing the electrodes so as to satisfy the relational expression in Expression 9.

Furthermore, in Table 3, upon comparing the solder states after mounting, references 5 through 7 exhibit a significantly favorable trend; no solder protrusion defects that exceed standard limits were observed. Moreover, although not indicated in Table 3, no occurrence of void defects that exceed standard limits were observed, either. This is conceivably due to the structural parameters that affect warpage, the ratio of surface area S and electrode perimeter length L of each electrode, total electrode surface area $S_a$, etc., in references 5 through 7 working to inhibit solder protrusion.

In regard to total electrode surface area $S_a$ in particular, since the amount of solder used in semiconductor device 1 can be reduced, the probability that solder protrusion will occur can be reduced. In references 5 through 7, total electrode surface area $S_a$ is less than 2.11 mm². Accordingly, total electrode surface area $S_a$ is desirably less than 2.11 mm².

This makes it possible to reduce the total amount of solder and thus inhibit solder protrusion defects.

Moreover, in Table 3, references 5 through 7 exhibiting a favorable solder state after mounting is conceivably due to the length of the shorter sides of each source electrode being at most 0.2 mm. Accordingly, the length of the shorter sides of each source electrode is desirably at most 0.2 mm. When the length of the shorter sides of each source electrode is at most 0.2 mm, volatile flux bubbles can contact the boundary between the solder and the outside earlier and dissipate, thereby making it possible to inhibit solder from being pushed out and triggering a protrusion.

Next, the relationship between the shape of the gate electrode and solder mounting defects will be described.

In references 1 through 7, each gate electrode has a unified shape of a circle having a diameter of 0.25 mm. No solder protrusion occurring in a gate electrode exceeding standard limits was observed in any of references 1 through 7, but a slight variance in the rate of occurrence of solder protrusion was observed across references 1 through 7. Since the shape of the gate electrodes is the same across references 1 through 7, there is no variance in surface area or perimeter length. In view of this, when the second film thickness converted weight (mg) calculated by converting the film thickness of each layer in semiconductor device 1 is represented as M', and the total electrode surface area is represented as $S_a$, the loads applied to the gate electrodes were compared by comparing M'/$S_a$ (the quotient of second film thickness converted weight M' divided by total electrode surface area $S_a$) per unit surface area for each of references 1 through 7. More specifically, among the data in Table 3, the correlation between (i) M'/$S_a$ and (ii) solder protrusion rate of occurrence within standard limits is approximated with a linear expression, and based on the linear expression, $M'/S_a$ was calculated so as to equal 10%, which is the threshold for rate of occurrence of solder protrusion in gate electrodes within standard limits. As a result, under the condition that $M'/S_a > 3.12$, this shows that the rate of occurrence of solder protrusion in gate electrodes within standard limits tends to be at least 10%, and tends to increase. Note that since second film thickness converted weight M' is expressed in Expression 2, the following Expression 10 is satisfied.
(MATH. 10)

$$0.0067 \times (2.33 \times t_{si} + 10.5 \times t_{ag} + 8.90 \times t_{ni})/S_a < 3.12$$

$$0.0067 \times (2.33 \times t_{si} + 10.5 \times t_{ag} + 8.90 \times t_{ni})/3.12 < S_a \quad \text{(Expression 10)}$$

With this, it is possible to inhibit solder protrusion by designing the gate electrodes so as to satisfy the relational expression in Expression 10.

Hereinbefore, defects related to solder protrusion and voids have been focused on, but there are other types of defects, such as when protruding solder jumps out of the perimeter of an electrode as a floating ball of solder (solder ball), or when a solder ball is reattaches to the side surface of semiconductor device 1 and hardens in a semispherical shape (side-surface solder adhesion). There is a high probability that solder balls or side-surface solder adhesion will result in a short circuit. Accordingly, if even one occurrence in one location can be confirmed, this results in the determination of a defect.

In Table 3, there are no occurrences of solder balls or side-surface solder adhesion in references 3 through 7 (however, in reference 4, a defect was observed only when the Si layer had a thickness of 20 µm, the Ag layer had a thickness of 50 µm, and the Ni layer had a thickness of 30 µm). This is conceivably due to source electrodes 11 and source electrodes 21 being disposed sufficiently spaced apart from a longer side of the Si layer so that even if solder jumped out it would not come to a stop on semiconductor device 1 (since solder balls that jump out from the perimeter of an electrode travel a long distance on semiconductor device 1, there is a considerably low probability that the solder ball would be captured by and adhere to the edge of semiconductor device 1, due to inertia).

In references 3 through 7, the distance between source electrodes 11 and 21 and a longer side of the Si layer (i.e., the longer-side margin) is greater than 0.15 µm. Accordingly, the distance between a longer side of the Si layer and source electrodes 11 and 21 is desirably at least 0.15 µm.

This makes it possible to inhibit the occurrence of a short circuit due to solder balls or side-surface solder adhesion.

Figure 12A:
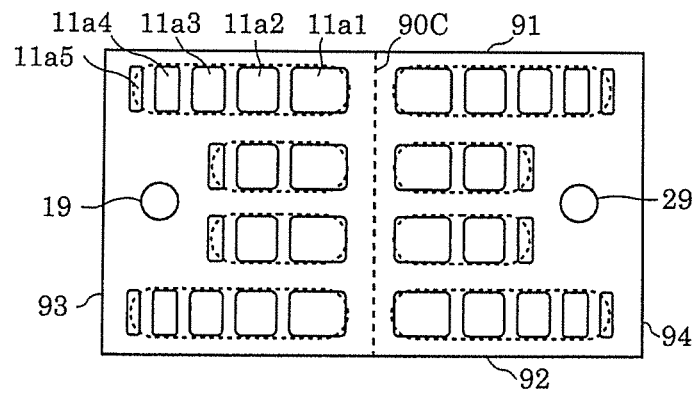
FIG. 12A illustrates an electrode layout configuration of source electrodes in a semiconductor device according to an embodiment.

FIG. 12A illustrates an electrode layout configuration of source electrodes in a semiconductor device according to an embodiment. As illustrated in FIG. 12A, source electrodes 11 and source electrodes 21 each include a plurality of electrodes.

Here, among the plurality of electrodes (for example, electrodes 11a1, 11a2, 11a3, 11a4, and 11a5) included in source electrodes 11, the surface area of a first electrode is greater than the surface area of a second electrode, the first electrode being closer to boundary line 90C in a direction along the longer side of the Si layer than the second electrode is, and the second electrode being closer to shorter side 93 of the Si layer in a direction along the longer side of the Si layer than the first electrode is. In FIG. 12A, for example, the surface area of electrode 11a1 is greater than the surface area of electrode 11a2, and, moreover, electrode 11a1 is formed closer to boundary line 90C than electrode 11a2 is, and electrode 11a2 is formed closer to shorter side 93 of the Si layer than electrode 11a1 is. Moreover, among the plurality of electrodes included in source electrodes 21, the surface area of a first electrode is greater than the surface area of a second electrode, the first electrode being closer to boundary line 90C in a direction along the longer side of the Si layer than the second electrode is, and the second electrode being closer to shorter side 94 of the Si layer in a direction along the longer side of the Si layer than the first electrode is.

As described above, when warpage occurs in a direction along the longer side of the Si layer, solder settle amount Δt is greater in the vicinities of shorter sides 93 and 94 than in the vicinity of boundary line 90C. In contrast, with the semiconductor device according to the present embodiment, since the surface areas of the electrodes formed closer to shorter sides 93 and 94 of the Si layer are less than the surface areas of the electrodes formed closer to boundary line 90C, the S/L of the electrodes formed closer to shorter sides 93 and 94 reduces. Accordingly, it is possible to reduce the force that attempts to push solder so as to protrude out (force F acting on the solder bumps).

Note that the configuration in which the surface area of the electrode formed closer to the shorter side is less than the surface area of the electrode formed closer to the boundary line may apply to at least one of source electrodes 11 or source electrodes 21.

Note that the plurality of electrodes included in source electrodes 11 may decrease in surface area in a direction along the longer side of the Si layer, from boundary line 90C toward shorter side 93. Moreover, the plurality of electrodes included in source electrodes 21 may decrease in surface area in a direction along the longer side of the Si layer, from boundary line 90C toward shorter side 94. Note that these configurations may apply to at least one of source electrodes 11 or source electrodes 21.

This makes it possible to effectively reduce the force that attempts to push solder so as to protrude out (force F acting on the solder bumps).

Figure 12B:
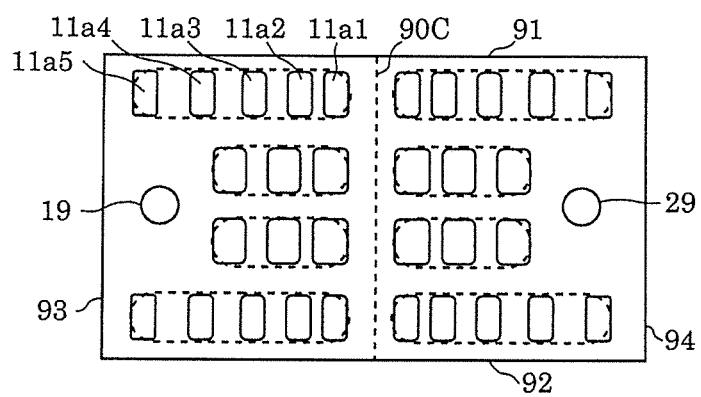
FIG. 12B illustrates an electrode layout configuration of source electrodes in a semiconductor device according to an embodiment.

FIG. 12B illustrates an electrode layout configuration of source electrodes in a semiconductor device according to an embodiment. As illustrated in FIG. 12B, source electrodes 11 and source electrodes 21 each include a plurality of electrodes.

Here, among the plurality of electrodes (for example, electrodes 11a1, 11a2, 11a3, 11a4, and 11a5) included in source electrodes 11, the distance between a first electrode and an adjacent electrode is shorter than the distance between a second electrode and an adjacent electrode, the first electrode being closer to boundary line 90C in a direction along the longer side of the Si layer than the second electrode is, and the second electrode being closer to shorter side 93 of the Si layer in a direction along the longer side of the Si layer than the first electrode is. Moreover, among the plurality of electrodes included in source electrodes 21, the distance between a first electrode and an adjacent electrode is shorter than the distance between a second electrode and an adjacent electrode, the first electrode being closer to boundary line 90C in a direction along the longer side of the Si layer than the second electrode is, and the second electrode being closer to shorter side 94 of the Si layer in a direction along the longer side of the Si layer than the first electrode is. Note that these configurations may apply to at least one of source electrodes 11 or source electrodes 21.

As described above, when warpage occurs in a direction along the longer side of the Si layer, solder settle amount Δt is greater in the vicinities of shorter sides 93 and 94 than in the vicinity of boundary line 90C. In contrast, with the semiconductor device according to the present embodiment, since the distance between adjacent electrodes formed closer to shorter sides 93 and 94 of the Si layer is longer than the distance between adjacent electrodes formed closer to boundary line 90C, the allowable amount of solder protrusion for electrodes formed closer to shorter sides 93 and 94 (for example, half the distance between adjacent electrodes) can be increased. Accordingly, solder protrusion defects can be reduced.

Note that the distance between adjacent electrodes among source electrodes 11 may increase in a direction along the longer side of the Si layer, from boundary line 90C toward shorter side 93. Moreover, the distance between adjacent electrodes among source electrodes 21 may increase in a direction along the longer side of the Si layer, from boundary line 90C toward shorter side 94. Note that these configurations may apply to at least one of source electrodes 11 or source electrodes 21.

This makes it possible to effectively reduce solder protrusion defects.

Figure 12C:
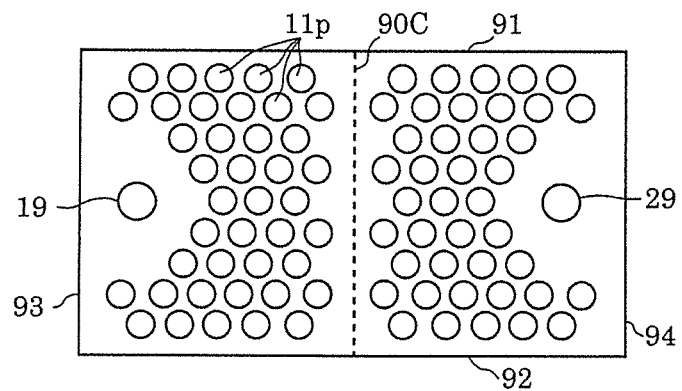
FIG. 12C illustrates an electrode layout configuration of source electrodes in a semiconductor device according to an embodiment.

FIG. 12C illustrates an electrode layout configuration of source electrodes in a semiconductor device according to an embodiment. As illustrated in FIG. 12C, source electrodes 11 and source electrodes 21 each include a plurality of electrodes.

Here, the surface area of each electrode (for example, electrodes 11p) included in source electrodes 11 may be smaller than the surface area of each electrode included in gate electrode 19, and the distance between any given two adjacent electrodes included in source electrodes 11 may be less than a width of each electrode included in gate electrode 19. Moreover, the surface area of each electrode included in source electrodes 21 may be smaller than the surface area of each electrode included in gate electrode 29, and the distance between any given two adjacent electrodes included in source electrodes 21 may be less than a width of each electrode included in gate electrode 29. Note that these configurations may apply to at least one of source electrodes 11 or source electrodes 21.

This makes it possible to reduce the S/L of the source electrodes. Thus, it is possible to reduce the force that causes solder to protrude from the source electrodes (force F acting on the solder bumps). Moreover, the distance between adjacent source electrodes is less than the width of the gate electrode, but source electrodes included in source electrodes 11 may contact one another, and source electrodes included in source electrodes 21 may contact one another. Compared to a single electrode whose surface area is equivalent to the total surface area of all electrodes included in source electrodes 11, with the above configuration, volatile flux bubbles can dissipate more easily, and since each electrode included in source electrodes 11 short circuits at the same potential, this is not problematic.

OTHER EMBODIMENTS

Although a semiconductor device according to one or more aspects of the present disclosure has been described based on an embodiment, the present disclosure is not limited to this embodiment. Those skilled in the art will readily appreciate that embodiments arrived at by making various modifications to the above embodiment or embodiments arrived at by selectively combining elements disclosed in the above embodiment without materially departing from the scope of the present disclosure may be included within one or more aspects of the present disclosure.

In the above embodiment, the bonding material for joining semiconductor device 1 and mounting substrate together is exemplified as solder bumps, but the embodiment of the bonding material is not limited to solder bumps, and the material of the bonding material is not limited to solder.

INDUSTRIAL APPLICABILITY

The semiconductor device according to the invention of the present application can be used as a CSP semiconductor device in a variety of semiconductor devices, such as a bidirectional transistor, unidirectional transistor, or diode.

REFERENCE MARKS IN THE DRAWINGS 1 semiconductor device
2 control IC
3 battery
4 load
10 transistor (first vertical MOS transistor)
11, 11a, 11b, 11c, 11d, 21, 21a, 21b, 21c, 21d source electrode
12, 13, 22, 23 section
14, 24 source region
15, 25 gate conductor
16, 26 gate insulating film
18, 28 body region
19, 29 gate electrode
20 transistor (second vertical MOS transistor)
30, 31 metal layer
30a, 30b, 31a, 31b, 40a, 40b principal surface
32 semiconductor substrate
33 low-concentration impurity layer
34 interlayer insulating film
35 passivation layer
40 semiconductor layer
90C boundary line
91, 92 longer side
93, 94 shorter side

The invention claimed is:

1. A semiconductor device which is a chip-size-package-type semiconductor device that is facedown mountable, the semiconductor device comprising:
    a semiconductor layer including a first principal surface and a second principal surface that face in opposite directions;
    a first metal layer that includes a third principal surface and a fourth principal surface that face in opposite directions, is disposed with the third principal surface in contact with the second principal surface, comprises silver, and has a thickness of at least 30 μm and less than 60 μm;
    a second metal layer that includes a fifth principal surface and a sixth principal surface that face in opposite directions, is disposed with the fifth principal surface in contact with the fourth principal surface, comprises nickel, and has a thickness of at least 10 μm and less than 35 μm;
    a first vertical MOS transistor disposed in a first region of the semiconductor layer; and
    a second vertical MOS transistor disposed in a second region of the semiconductor layer, the second region being adjacent to the first region in a direction along the first principal surface,
    wherein the semiconductor layer includes:
        a semiconductor substrate that is disposed on the second principal surface side among the first principal surface and the second principal surface, and comprises silicon containing an impurity of a first conductivity type; and
a low-concentration impurity layer that is disposed on the first principal surface side among the first principal surface and the second principal surface, is in contact with the semiconductor substrate, and contains an impurity of the first conductivity type in a lower concentration than a concentration of the impurity of the first conductivity type in the semiconductor substrate,
the first vertical MOS transistor includes a first source electrode and a first gate electrode on a surface of the low-concentration impurity layer,
the second vertical MOS transistor includes a second source electrode and a second gate electrode on the surface of the low-concentration impurity layer,
in a plan view of the semiconductor layer, (i) the first source electrode and the first gate electrode, and (ii) the second source electrode and the second gate electrode have line symmetry about a boundary line that divides a longer side of the semiconductor layer into two parts,
the semiconductor layer has a thickness of at least 10 urn and at most 30 μm,
the semiconductor substrate functions as a common drain region serving as both a first drain region of the first vertical MOS transistor and a second drain region of the second vertical MOS transistor,
a bidirectional path from the first source electrode to the second source electrode via the first drain region, the first metal layer, and the second drain region is a primary current path,
a ratio of lengths of the longer side and a shorter side of the semiconductor layer is at most 1.73,
a ratio of a surface area and a perimeter length of each electrode included in the first source electrode and the second source electrode is at most 0.127,
a cumulative surface area of the first source electrode, the first gate electrode, the second source electrode, and the second gate electrode is at most 2.61 mm$^2$,
a length of a shorter side of each of the first source electrode and the second source electrode is at most 0.3 mm, and $$702 < 2.33 \times t_{si} + 10.5 \times t_{ag} + 8.90 \times t_{ni} < 943 \quad \text{(MATH. 1)}$$

is satisfied, where $t_{si}$ (μm) is the thickness of the semiconductor layer, $t_{ag}$ (μm) is the thickness of the first metal layer, and $t_{ni}$ (μm) is the thickness of the second metal layer.

2. The semiconductor device according to claim 1, wherein $$790 \leq 2.33 \times t_{si} + 10.5 \times t_{ag} + 8.90 \times t_{ni} \quad \text{(MATH. 2)}$$

is satisfied.

3. The semiconductor device according to claim 2,
wherein the first source electrode includes a plurality of electrodes and the second source electrode includes a plurality of electrodes,
in the plan view, a lengthwise direction of each of the plurality of electrodes included in the first source electrode and the second source electrode is parallel to the longer side of the semiconductor layer, the plurality of electrodes included in the first source electrode are disposed in a striped pattern, and the plurality of electrodes included in the second source electrode are disposed in a striped pattern, and
a length of a longer side of each of the plurality of electrodes included in the first source electrode and the second source electrode is at least 0.85 mm and at most 1.375 mm.

4. The semiconductor device according to claim 2,
wherein a maximum width of each of the first gate electrode and the second gate electrode is at most 0.25 mm, and
in the plan view, the first gate electrode is disposed closer to a shorter side of the semiconductor layer than the first source electrode is and spaced apart from the first source electrode, and the second gate electrode is disposed closer to a shorter side of the semiconductor layer than the second source electrode is and spaced apart from the second source electrode.

5. The semiconductor device according to claim 2,
wherein the length of the shorter side of the semiconductor layer is less than 2.00 mm,
the thickness of the semiconductor layer is approximately 20 μm, and
the thickness of the second metal layer is greater than 15 μm.

6. The semiconductor device according to claim 1,
wherein the first source electrode includes a plurality of electrodes and the second source electrode includes a plurality of electrodes,
in the plan view, a lengthwise direction of each of the plurality of electrodes included in the first source electrode and the second source electrode is parallel to the longer side of the semiconductor layer, the plurality of electrodes included in the first source electrode are disposed in a striped pattern, and the plurality of electrodes included in the second source electrode are disposed in a striped pattern, and
a length of a longer side of each of the plurality of electrodes included in the first source electrode and the second source electrode is at least 0.85 mm and at most 1.375 mm.

7. The semiconductor device according to claim 1,
wherein a maximum width of each of the first gate electrode and the second gate electrode is at most 0.25 mm, and
in the plan view, the first gate electrode is disposed closer to a shorter side of the semiconductor layer than the first source electrode is and spaced apart from the first source electrode, and the second gate electrode is disposed closer to a shorter side of the semiconductor layer than the second source electrode is and spaced apart from the second source electrode.

8. The semiconductor device according to claim 1,
wherein the length of the shorter side of the semiconductor layer is less than 2.00 mm,
the thickness of the semiconductor layer is approximately 20 μm, and
the thickness of the second metal layer is greater than 15 μm.

9. The semiconductor device according to claim 1,
wherein the thickness of the semiconductor layer is approximately 20 μm,
the thickness of the first metal layer is at least approximately 50 μm,
the thickness of the second metal layer is approximately 30 μm, and
the ratio of the surface area and the perimeter length of each electrode included in the first source electrode and the second source electrode is less than 0.10.

10. The semiconductor device according to claim 9, wherein

[MATH. 3]

$$Xs < \frac{Ys}{5.00 \cdot Ys - 1}$$

is satisfied, where Xs is a length of a longer side of each electrode included in the first source electrode and the second source electrode, and Ys is the length of the shorter side of each electrode included in the first source electrode and the second source electrode.

11. The semiconductor device according to claim 10, wherein the length of the shorter side of each electrode included in the first source electrode and the second source electrode is at most 0.2 mm.

12. The semiconductor device according to claim 9, wherein the cumulative surface area of each electrode included in the first source electrode, the first gate electrode, the second source electrode, and the second gate electrode is less than 2.11 mm².

13. The semiconductor device according to claim 12, wherein the length of the shorter side of each electrode included in the first source electrode and the second source electrode is at most 0.2 mm.

14. The semiconductor device according to claim 9, wherein $$0.0067 \times (2.33 \times t_{si} + 10.5 \times t_{ag} + 8.90 \times t_{ni})/3.12 < S_a \quad \text{(MATH. 4)}$$

is satisfied, where $S_a$ is the cumulative surface area of each electrode included in the first source electrode, the first gate electrode, the second source electrode, and the second gate electrode.

15. The semiconductor device according to claim 9, wherein each electrode included in the first source electrode and the second source electrode is spaced apart from each side of the semiconductor layer by at least 0.153 mm.

16. The semiconductor device according to claim 1, wherein the first source electrode includes a plurality of electrodes and the second source electrode includes a plurality of electrodes, and
among at least one of (i) the plurality of electrodes included in the first source electrode and (ii) the plurality of electrodes included in the second source electrode, the surface area of a first electrode is greater than the surface area of a second electrode, the first electrode being disposed closer to the boundary line than the second electrode is, and the second electrode being disposed closer to a shorter side of the semiconductor layer than the first electrode is.

17. The semiconductor device according to claim 16, wherein electrodes among at least one of (i) the plurality of electrodes included in the first source electrode and (ii) the plurality of electrodes included in the second source electrode decrease in surface area in a direction from the boundary line toward the shorter side.

18. The semiconductor device according to claim 1, wherein the first source electrode includes a plurality of electrodes and the second source electrode includes a plurality of electrodes, and
among at least one of (i) the plurality of electrodes included in the first source electrode and (ii) the plurality of electrodes included in the second source electrode, a distance between a first electrode and an adjacent electrode is shorter than a distance between a second electrode and an adjacent electrode, the first electrode being disposed closer to the boundary line than the second electrode is, and the second electrode being disposed closer to a shorter side of the semiconductor layer than the first electrode is.

19. The semiconductor device according to claim 18, wherein a distance between two adjacent electrodes among at least one of (i) the plurality of electrodes included in the first source electrode and (ii) the plurality of electrodes included in the second source electrode increases in a direction from the boundary line toward the shorter side.

20. The semiconductor device according to claim 1, wherein the first source electrode includes a plurality of electrodes and the second source electrode includes a plurality of electrodes,
the surface area of each electrode among at least one of (i) the plurality of electrodes included in the first source electrode and (ii) the plurality of electrodes included in the second source electrode is smaller than a surface area of each electrode included in the first gate electrode and the second gate electrode, and
among the at least one of (i) the plurality of electrodes included in the first source electrode and (ii) the plurality of electrodes included in the second source electrode, a distance between any given two adjacent electrodes is less than a width of each electrode included in the first gate electrode and the second gate electrode.

* * * * *